(12) United States Patent
Okumura et al.

(10) Patent No.: US 6,875,307 B2
(45) Date of Patent: Apr. 5, 2005

(54) METHOD AND APPARATUS FOR PLASMA PROCESSING

(75) Inventors: Tomohiro Okumura, Kadoma (JP); Ichiro Nakayama, Kadoma (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 147 days.

(21) Appl. No.: 10/060,350

(22) Filed: Feb. 1, 2002

(65) Prior Publication Data

US 2002/0079058 A1 Jun. 27, 2002

Related U.S. Application Data

(62) Division of application No. 09/589,204, filed on Jun. 8, 2000, which is a division of application No. 09/048,254, filed on Mar. 26, 1998, now Pat. No. 6,093,457.

(30) Foreign Application Priority Data

Mar. 27, 1997 (JP) ............................................. 9-75436
May 22, 1997 (JP) ............................................. 9-132110

(51) Int. Cl.$^7$ ............................ C23C 16/00; C23F 1/00
(52) U.S. Cl. ................................ 156/345.48; 118/723 I
(58) Field of Search .................... 118/723 I, 723 IR, 118/723 AN; 156/345.48, 345.49; 315/111.51

(56) References Cited

U.S. PATENT DOCUMENTS

| | | | |
|---|---|---|---|
| 5,529,657 A | 6/1996 | Ishii | |
| 5,690,781 A | 11/1997 | Yoshida et al. | |
| 5,693,238 A | 12/1997 | Schmitt et al. | |
| 5,795,429 A | * 8/1998 | Ishii et al. | 156/345.48 |
| 5,888,413 A | * 3/1999 | Okumura et al. | 216/68 |
| 6,270,617 B1 | 8/2001 | Yin et al. | |

FOREIGN PATENT DOCUMENTS

| | | |
|---|---|---|
| JP | 7-106316 | 4/1985 |
| JP | 6-280029 | * 4/1994 |
| JP | 7-307200 | 11/1995 |
| JP | 8-83696 | 3/1996 |
| JP | 9-55375 | * 2/1997 |

OTHER PUBLICATIONS

Hahm et al., "Characteristics of Stabilized Pulsed Plasma Via Suppression of Side Band Modes", Dry Process Symposium (1996).

"Basic Engineering of Plasma", p. 58, by Sinriki Teii, Uchida Rokakuho Publishing Co., Ltd. 1986).

"New Ultra–High–Frequency Plasma Source for Large–Scale Etching Processes", Jpn. J. Appl. Phys., Vo. 34, Pt. 1, No. 12B (1995) by Samukawa et al.

* cited by examiner

Primary Examiner—Luz Alejandro-Mulero
(74) Attorney, Agent, or Firm—Wenderoth, Lind & Ponack, L.L.P.

(57) ABSTRACT

A plasma processing method includes controlling a pressure of an interior of a vacuum chamber to a specified pressure by exhausting the interior of the vacuum chamber while supplying gas into the interior of vacuum chamber. While the pressure of the interior of the vacuum chamber is being controlled, high-frequency power is supplied to one end of a first conductor which is opened at another end, and which is configured as a vortex. Also, grounding one end of a second conductor which is opened at another end and which is configured as a vortex. Finally, electromagnetic waves from the first conductor and the second conductor radiate into the vacuum chamber, generating plasma in the vacuum chamber and processing a substrate placed on the electrode within the vacuum chamber.

6 Claims, 11 Drawing Sheets

NOTCH

NOTCH

US 6,875,307 B2

METHOD AND APPARATUS FOR PLASMA PROCESSING

This is a Divisional Application of Ser. No. 09/589,204, filed Jun. 8, 2000, which is a Divisional Application of Ser. No. 09/048,254, filed Mar. 26, 1998 now U.S. Pat. No. 6,093,457.

BACKGROUND OF THE INVENTION

The present invention relates to a method and apparatus for plasma processing such as dry etching, sputtering, and plasma CVD which are used in the fabrication of semiconductors or other electronic devices. In particular, the invention relates to a method and apparatus for plasma processing which makes use of low-electronic-temperature plasma.

To keep up with the miniaturization of electronic devices such as semiconductors, it has been discussed in Unexamined Japanese Laid-Open Patent Publication No. 8-83696 that using high-density plasma is important. Meanwhile, in recent years, attention has been focused on low-electronic-temperature plasma of high electron deficiency and low electron temperature.

When gases having a high electronegativity such as C12 and $SF_6$, i.e., gases that are liable to cause negative ions, are transformed into plasma, electron temperatures of about 3 eV or lower will cause larger amounts of negative ions to be generated as compared with cases of higher electron temperatures. Taking advantage of this phenomenon makes it possible to prevent the configurational abnormality of etching so called notches, which are caused by positive charges accumulating at the bottom of a fine pattern due to excessive incoming positive ions. Thus, etching of extremely fine patterns can be carried out with high precision.

Also, when gases containing carbon and fluorine such as CxFy and CxHyFz (where x, y and z are natural integers), which are commonly used in the etching of silicon oxide film and other insulating films, are transformed into plasma, electron temperatures of about 3 eV or lower will suppress the decomposition of gases, particularly the generation of F atoms, F radicals and the like, as compared with cases of higher electron temperatures. Since F atoms, F radicals and the like, have higher etching speeds on silicon, lower electron temperatures enable an insulating-film etching having a larger selection ratio to silicon to be achieved.

Further, 3 eV or lower electron temperatures will cause the ion temperature to be lower as well, enabling a reduction of ion damage to the substrate in plasma CVD.

In the examples shown above, greater results are generated with lower electron temperatures, where remarkable results could not be expected immediately when the electron temperature has reached 3 eV. Plasma of 2 eV or lower electron temperatures are considered to be one effective for several generations of devices in the future.

In turn, the electron temperature is as high as 4 to 6 eV in ECRP (Electronic Cyclotron Resonance Plasma) or HWP (Helicon Wave Plasma) using a static magnetic field, and 3 to 4 eV in ICP (Inductively Coupled Plasma) using no static magnetic field. The electron temperature for plasma is the most difficult to control among the plasma parameters. It could be said that the electron temperature almost completely depends on the plasma source, i.e. the method of plasma generation. Even if external parameters such as the type of gas, gas flow rate, gas pressure, magnitude of applied high-frequency power and configuration of vacuum chamber are changed, the electron temperature shows almost no changes. However, there have been some methods proposed recently. Some of them are described in detail below.

FIG. 18 is a cross-sectional view of an ICP etching equipment. Referring to FIG. 18, while an interior of a vacuum chamber 21 is held at a specified pressure by simultaneously effecting exhaustion with a pump 23 and introduction of specified gas from a gas supply unit 22 into the vacuum chamber 21, high-frequency power of 13.56 MHz is supplied by a high-frequency power source 24 to a coil 26 placed on a dielectric 25 and grounded at its one end, by which plasma is generated in the vacuum chamber 21, enabling plasma processing such as etching, deposition and surface reforming to be achieved on a substrate 28 placed on an electrode 27. In this process, as shown in FIG. 18, also supplying high-frequency power to the electrode 27 by a high-frequency power source 29 makes it possible to control the ion energy that reaches the substrate 28. In addition, for impedance matching, a matching circuit 30 is disposed between the high-frequency power source 24 and the coil 26. It is known that after the high-frequency power applied to the coil 26 is turned off, the electron temperature rapidly lowers at a time constant on the order of several $\mu$sec in the afterglow plasma. Meanwhile, the time constant at which the plasma density decreases is greater than the time constant for the relaxation time of electron temperature, so that modulating the high-frequency power by using a pulse of about 50 to 200 kHz allows the electron temperature to be set to 2 eV or lower without greatly decreasing the electron density. In addition, a technique that differs in coil form but is essentially the same as the foregoing pulse-modulation ICP system is described in detail in J. H. Hahm et al., "Characteristics of Stabilized Pulsed Plasma Via Suppression of Side Band Modes", Proceedings of Symposium on Dry Process (1996). Also, the pulsed discharge plasma and the afterglow plasma are described in detail in Sinriki Teii, "Basic Engineering of Plasma", p. 58, UCHIDA ROKAKUHO PUBLISHING CO., LTD. (1986).

FIG. 19 is a cross-sectional view of an etching equipment on which a spoke antenna type plasma source is mounted. Referring to FIG. 19, while interior of a vacuum chamber 31 is held at a specified pressure by simultaneously effecting exhaustion with a pump 33 and introduction of specified gas from a gas supply unit 32 into the vacuum chamber 31, high-frequency power of 500 MHz is supplied by a high-frequency power source 34 to a spoke antenna 36 placed on a dielectric 35, by which plasma is generated in the vacuum chamber 31, enabling plasma processing such as etching, deposition and surface reforming to be achieved on a substrate 38 placed on an electrode 37. In this process, as shown in FIG. 19, also supplying high-frequency power to the electrode 37 with a high-frequency power source 39 makes it possible to control the ion energy that reaches the substrate 38. For impedance matching, a stub 40 is disposed between the high-frequency power source 34 and the spoke antenna 36. Although clear reasons have not yet been found, a low electron temperature of 2 eV or lower has been realized with a spoke antenna type plasma source using high-frequency power of 500 MHz. In addition, this system is described in detail in S. Samukawa et al., "New Ultra-High-Frequency Plasma Source for Large-Scale Etching Processes", Jpn. J. Appl. Phys., Vol. 34, Pt. 1, no 12B (1995).

However, with the conventional system as shown in FIG. 18, there is an issue with a reflected-wave power of as much as 10% or more of the traveling wave power being generated. This is because a Q (Quality factor: reactance component of impedance/resistance component), as the range of from the matching circuit 30 to the coil 26 is taken as one load is very high as a result of a narrow-band load, such that matching cannot be obtained for frequency components equal to or other than the fundamental harmonic wave (13.56 MHz) that are generated with pulse modulation and most of the frequency components are returned to the power source as reflected waves. Also, even if plasma is generated under these conditions, the reflected-wave power is not constant at all times, making it very difficult to obtain reproducibility of processing results of the processing rate.

Also, with the conventional system as shown in FIG. 19, there is an issue that plasma is not generated with low pressure. In particular, it is very difficult to generate plasma in low pressure regions of 3 Pa or lower. This is a common issue for plasma sources using frequencies of the UHF band or higher (300 MHz or higher) using no static magnetic field. For example, without the static magnetic field, plasma could not be generated at low pressure even with an ECR plasma source using 2.45 GHz. Since actual plasma processing, such as etching, is usually carried out at around 1 Pa, this system needs to first generate plasma in a high pressure region where plasma generation is ensured, and then changing the pressure to a desired one by increasing the discharge speed of the pump or decreasing the gas flow rate. However, applying such a method would make it impossible to achieve etching or other processing with high precision. To avoid this; it is necessary to generate plasma by generating a strong static magnetic field within the vacuum chamber 1 under control of the pressure to a desired pressure of around 1 Pa, and then enhancing the efficiency of the electron acceleration using magnetic waves, or to generate plasma by using a trigger discharge of some other system. However, using the static magnetic field or the trigger discharge leads to a considerably increased risk of thin insulating-film breakdown in the semiconductor device, called charge-up damage. Further, where a use of frequencies of the UHF band or higher (300 MHz or higher) including 500 MHz would require the stub 40 for impedance matching, it is inevitable that both weight and volume are enlarged as compared with the matching circuit formed up from variable capacitors. This leads to another issue in terms of cost.

SUMMARY OF THE INVENTION

In view of the above-described issues of the prior art, the present invention is proposed to provide a method and apparatus for generating plasma capable of generating uniform, low-electron-temperature plasma under a low pressure.

In accomplishing these and other aspects, as claimed in a first aspect of the present invention, there is provided a plasma processing method comprising:

controlling an interior of a vacuum chamber to a specified pressure by exhausting interior of the vacuum chamber while supplying gas into the vacuum chamber;

under pressure control of the interior of the vacuum chamber, supplying high-frequency power to a conductor and radiating electromagnetic waves from the conductor into the vacuum chamber so that an ion saturation current density distribution within a plane parallel to a substrate surface of a substrate in a space distant from the substrate surface by a specified distance has a ring-shaped high-density portion; and generating plasma in the vacuum chamber and processing the substrate placed on an electrode within the vacuum chamber.

According to a second aspect of the present invention, there is provided a plasma processing method according to the first aspect, wherein a frequency of the high-frequency power supplied to the conductor is within a range of 50 to 150 MHz.

According to a third aspect of the present invention, there is provided a plasma processing method according to the first aspect, wherein the specified distance is not less than 50 mm.

According to a fourth aspect of the present invention, there is provided a plasma processing method according to the first aspect, wherein the high-frequency power supplied to the conductor is modulated in a pulse-like fashion, and a ratio of a maximum value to a minimum value of the high-frequency power is 10 or more.

According to a fifth aspect of the present invention, there is provided a plasma processing method comprising:

controlling an interior of a vacuum chamber to a specified pressure by exhausting interior of the vacuum chamber while supplying gas into the vacuum chamber;

under pressure control of the interior of the vacuum chamber, supplying high-frequency power to one end of a first conductor which is opened at another end and which has a vortex shape and grounding one end of a second conductor which is opened at another end and which has a vortex shape and radiating electromagnetic waves from the first conductor and the second conductor into the vacuum chamber; and generating plasma in the vacuum chamber and processing a substrate placed on an electrode within the vacuum chamber.

According to a sixth aspect of the present invention, there is provided a plasma processing method according to the fifth aspect, wherein a frequency of the high-frequency power supplied to the first conductor is within a range of 50 to 150 MHz.

According to a seventh aspect of the present invention, there is provided a plasma processing method according to the fifth aspect, wherein the high-frequency power supplied to the first conductor is modulated in a pulse-like fashion, a ratio of maximum value to minimum value of the high-frequency power is 10 or more, the first conductor and the second conductor are provided inside the vacuum chamber, the high-frequency power is supplied to the one end which is a center-side end portion of the vortex formed by the first conductor, the pressure is not more than 2 Pa, and when the high-frequency power is supplied to the one end of the first conductor, the high-frequency power is supplied to the electrode.

According to an eighth aspect of the present invention, there is provided a plasma processing apparatus comprising:

a device for supplying gas into an interior of a vacuum chamber;

a device for exhausting the interior of the vacuum chamber;

an electrode for placing a substrate thereon; and a dielectric;

a conductor for radiating electromagnetic waves into the vacuum chamber via the dielectric in order to generate plasma having a ring-shaped high-density portion within a plane parallel to a surface of the substrate placed on the electrode in a space distant from the substrate surface by a specified distance; and a high-frequency power source for supplying high-frequency power to the conductor to generate the plasma.

According to a ninth aspect of the present invention, there is provided a plasma processing apparatus according to the eighth aspect, wherein a frequency of the high-frequency power supplied to the conductor is within a range of 50 to 150 MHz.

According to a tenth aspect of the present invention, there is provided a plasma processing apparatus according to the eighth aspect, wherein the specified distance is not less than 50 mm.

According to an eleventh aspect of the present invention, there is provided a plasma processing apparatus according to the eighth aspect, further comprising a device for modulating the high-frequency power supplied to the conductor in a pulse-like fashion, a ratio of a maximum value to a minimum value of the high-frequency power can be 10 or more, and the conductor is provided inside or outside the vacuum chamber.

According to a twelfth aspect of the present invention, there is provided a plasma processing apparatus comprising:

a device for supplying gas into an interior of a vacuum chamber;

a device for exhausting the interior of the vacuum chamber;

a high-frequency power source for supplying high-frequency power;

an electrode for placing a substrate thereon;

a dielectric;

a first conductor which has one end opened and another end connected to a hot side of the high-frequency power and which has a vortex shape; and a second conductor which has one end opened and another end grounded and which has a vortex shape.

According to a thirteenth aspect of the present invention, there is provided a plasma processing apparatus according to the twelfth aspect, further comprising a device for modulating the high-frequency power supplied to the first conductor in a pulse-like fashion, wherein the hot side of the high-frequency power has a frequency of 50 to 150 MHz is connected to the first conductor, wherein a ratio of a maximum value to a minimum value of the high-frequency power can be 10 or more, wherein a center-side end portion of the vortex formed by the first conductor is connected to the hot side of the high-frequency power, the apparatus can be operated on a pressure of not more than 2 Pa, and the apparatus further comprising a device for supplying the high-frequency power to the electrode.

According to a fourteenth aspect of the present invention, there is provided a plasma processing apparatus according to the twelfth aspect, wherein the first conductor and the second conductor are provided inside or outside the vacuum chamber.

According to a fifteenth aspect of the present invention, there is provided a plasma processing apparatus according to the twelfth aspect, wherein the first conductor and the second conductor form multiple vortices.

According to a sixteenth aspect of the present invention, there is provided a plasma processing apparatus according to the twelfth aspect, wherein a length of the first conductor is approximately ¼ or ½ or ⅝ of a wavelength of the high-frequency power or the same as the wavelength of the high-frequency power, and a length of the second conductor is approximately ¼ or ½ or ⅝ of a wavelength of the high-frequency power or the same as the wavelength of the high-frequency power.

According to a seventeenth aspect of the present invention, there is provided a plasma processing apparatus according to the twelfth aspect, wherein each of the first and second conductors has a substantially plane vortex shape, and at an intersecting point, a straight line passes through a center-side end portion of the vortex formed by the first conductor crosses the first conductor on a plane on which the first conductor is laid down, an angle formed by a tangential line of the first conductor and the straight line is generally constant all over the first conductor, and at an intersecting point, a straight line passes through a center-side end portion of the vortex formed by the second conductor crosses the second conductor on a plane on which the second conductor is laid down, an angle formed by a tangential line of the second conductor and the straight line is generally constant all over the second conductor.

According to a eighteenth aspect of the present invention, there is provided a plasma processing apparatus according to the twelfth aspect, wherein each of the first and second conductors is of dome-shaped shape, and assuming projected images of the first conductor and the second conductor onto a plane parallel to the substrate, at an intersecting point on the plane, a straight line passes through a center-side end portion of the vortex formed by the projected image of the first conductor crosses the projected image of the first conductor, an angle formed by a tangential line of the projected image of the first conductor and the straight line is generally constant all over the projected image of the first conductor, and at an intersecting point on the plane, a straight line passes through a center-side end portion of the vortex formed by the projected image of the second conductor crosses the projected image of the second conductor, an angle formed by a tangential line of the projected image of the second conductor and the straight line is generally constant all over the projected image of the second conductor.

According to a nineteenth aspect of the present invention, there is provided a plasma processing method comprising:

controlling an interior of a vacuum chamber to a specified pressure by exhausting the interior of the vacuum chamber while supplying gas into the interior the vacuum chamber;

under pressure control of the interior of the vacuum chamber, supplying high-frequency power to a substantially center portion of a first conductor which comprises a plurality of conductors each having a vortex shape with their substantially center portions electrically connected to one another and outer-peripheral end portions opened to have multiple-vortex shape; and generating plasma in the vacuum chamber and processing a substrate placed on an electrode within the vacuum chamber.

According to a twentieth aspect of the present invention, there is provided a plasma processing method according to the nineteenth aspect, wherein a frequency of the high-frequency power supplied to the first conductor is within a range of 50 to 150 MHz, the high-frequency power supplied to the first conductor is modulated in a pulse-like fashion, a ratio of a maximum value to a minimum value of the high-frequency power is 10 or more.

According to a twenty-first aspect of the present invention, there is provided a plasma processing method according to the nineteenth aspect, wherein the substrate is processed in a state that multiple vortices formed by a multiple-vortex-shape second conductor which has near-center-portion end portions not connected to one another but opened and which has outer-peripheral end portions grounded are sandwiched between multiple vortices formed by the first conductor.

According to a twenty-second aspect of the present invention, there is provided a plasma processing apparatus comprising:

a device for supplying gas into an interior of a vacuum chamber;

a device for exhausting the interior of the vacuum chamber;

a high-frequency power source for supplying high-frequency power;

an electrode for placing a substrate thereon;

a dielectric;

a multiple-vortex-shape first conductor which has outer-peripheral end portions opened and which comprises a plurality of vortex-shape conductors with their substantially center portions electrically connected to one another, a substantially center portion of the first conductor being connected to a hot side of the high-frequency power.

According to a twenty-third aspect of the present invention, there is provided a plasma processing apparatus according to the twenty-second aspect, wherein a frequency of the high-frequency power supplied to the first conductor is within a range of 50 to 150 MHz, the high-frequency power supplied to the first conductor is modulated in a pulse-like fashion, a ratio of a maximum value to a minimum value of the high-frequency power is 10 or more.

According to a twenty-fourth aspect of the present invention, there is provided a plasma processing apparatus according to the twenty-second aspect, wherein a length of each vortex of multiple vortices formed by the first conductor is approximately ¼ or ½ or ⅝ of a wavelength of the high-frequency power or the same as the wavelength of the high-frequency power, and the pressure is not more than 2 Pa, further comprising a device for supplying the high-frequency power to the electrode.

According to a twenty-fifth aspect of the present invention, there is provided a plasma processing apparatus according to the twenty-second aspect, wherein multiple vortices formed by the multiple-vortex-shape second conductor which has near-center-portion end portions not connected to each other but opened and which has outer-peripheral end portions grounded are sandwiched between multiple vortices formed by the first conductor.

According to a twenty-sixth aspect of the present invention, there is provided a plasma processing apparatus according to the twenty-fifth aspect, wherein a length of each vortex of multiple vortices formed by the second conductor is approximately ¼ or ½ or ⅝ of a wavelength of the high-frequency power or the same as the wavelength of the high-frequency power.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
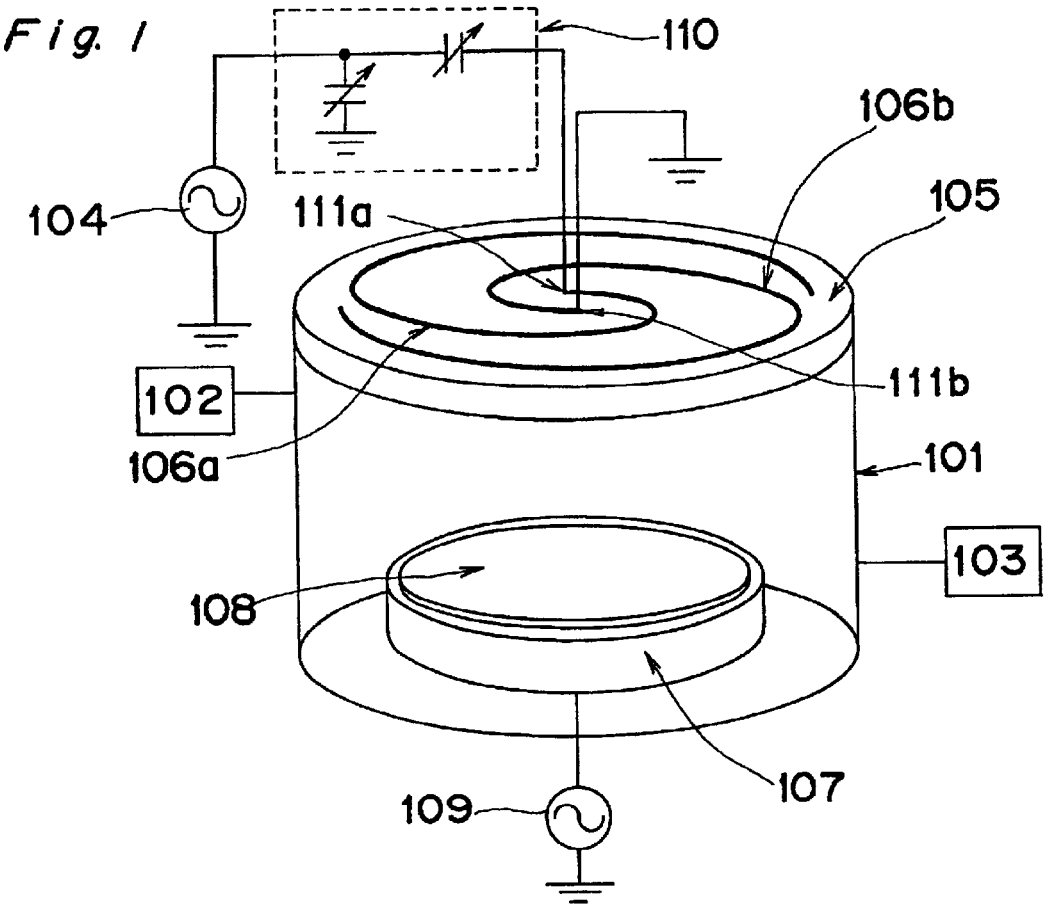
FIG. 1 is a perspective view showing a plasma processing apparatus used in a first embodiment of the invention.

Before the description of the present invention proceeds, it is to be noted that like parts are designated by like reference numerals throughout the accompanying drawings.

Hereinbelow, a first embodiment of the present invention is described with reference to FIGS. 1 through 7. FIG. 1 shows a perspective view of a plasma processing apparatus used in the first embodiment of the invention. Referring to FIG. 1, while an interior of a vacuum chamber 101 is held at a specified pressure by simultaneously effecting exhaustion with a pump 103 and introduction of specified gas from a gas supply unit 102 into the vacuum chamber 101, a high-frequency power of 100 MHz is supplied by a high-frequency power source 104 to a first conductor 106a including a conducting material and placed on a dielectric 105, and a second conductor 106b including a conducting material which is grounded, by which plasma is generated in the vacuum chamber 101, enabling plasma processing such as etching, deposition and surface reforming to be achieved on a substrate 108 placed on an electrode 107. For achieving this plasma processing, a center-side end portion 111a of a vortex formed by the first conductor of 106a is connected to a hot side of the high-frequency power. Also, a center-side end portion 111b of a vortex formed by the second conductor 106b is grounded. The first and second conductors 106a, 106b are substantially plane and of vortex type, their respective outer ends being opened. The first conductor 106a and the second conductor 106b are made of copper, and are arranged so as to form a multiple vortex. A high-frequency power source 109 dedicated to the electrode 107 and functioning to supply high-frequency power to the electrode 107 is provided so that ion energy that reaches the substrate 108 can be controlled. For impedance matching, a matching circuit 110 comprising two variable capacitors is provided between the high-frequency power source 104 and the first conductor 106a. Further, the high-frequency power source 104 is capable of modulating high-frequency power in a pulse-like fashion.

Figure 18:
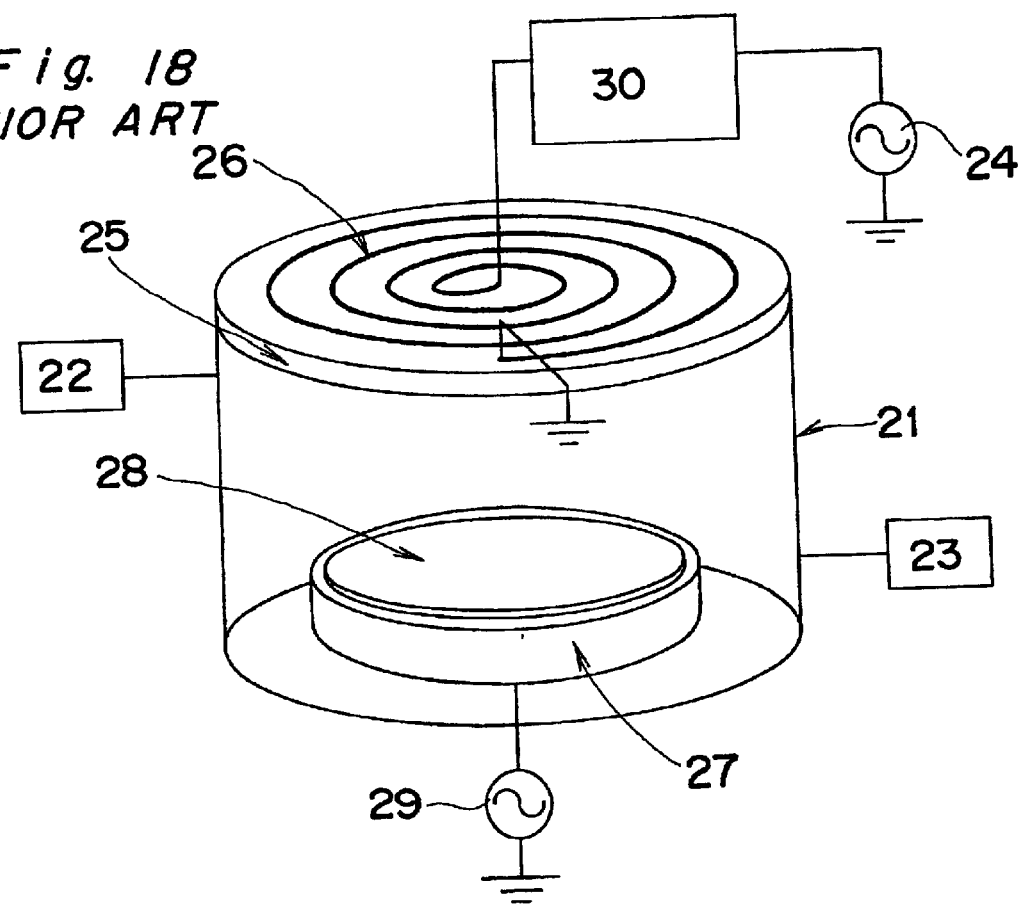
FIG. 18 is a perspective view showing the arrangement of the plasma processing apparatus used in the prior art example.
Figure 19:
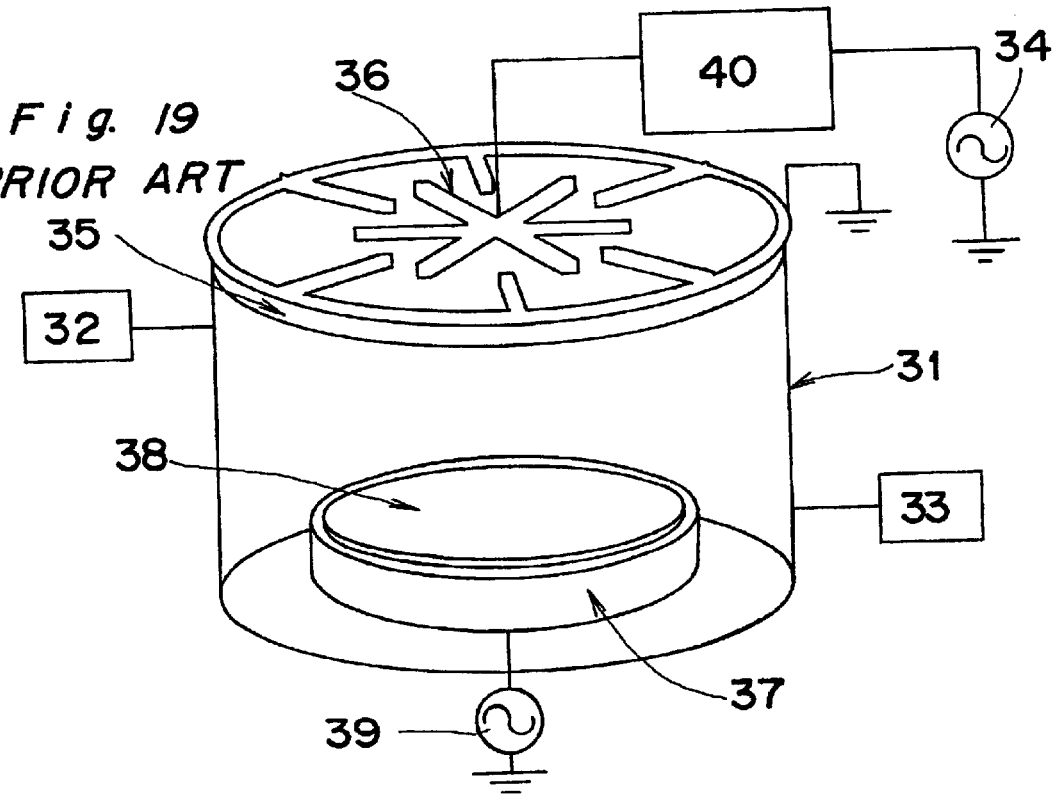
FIG. 19 is a perspective view showing the arrangement of a plasma processing apparatus used in another prior art example.

It should be noted that the plasma processing apparatus used in the first embodiment of the invention employs a plasma source essentially different from that of the ICP etching equipment of the prior art as described in FIG. 18. In more detail, one end of a coil 26 is grounded in the prior art example shown in FIG. 18, whereas one end of the first conductor 106a is opened in the first embodiment of the invention. For this reason, in the prior art example shown in FIG. 18, a current flowing through the coil 26 is nearly constant in any portion of the coil 26, and electrons are accelerated by a high-frequency electric field induced by a high-frequency magnetic field formed in a vacuum chamber 21 by the aforementioned current. By contrast, in the first embodiment of the invention, a voltage standing wave and a current standing wave occur from the first conductor 106a and the second conductor 106b, and electromagnetic waves radiated into the vacuum chamber 101 by these standing waves serve to cause the acceleration of electrons. Accordingly, the first conductor 106a and the second conductor 106b used in the first embodiment of the invention, although of vortex type, should not be called coils but could appropriately be called antennas. However, because there are some cases in which coils in the ICP system are called "antennas", as in Unexamined Japanese Laid-Open Patent Publication No. 7-106316, the description herein will be made without using the term, "antennas", for the avoidance of confusion.

Figure 2:
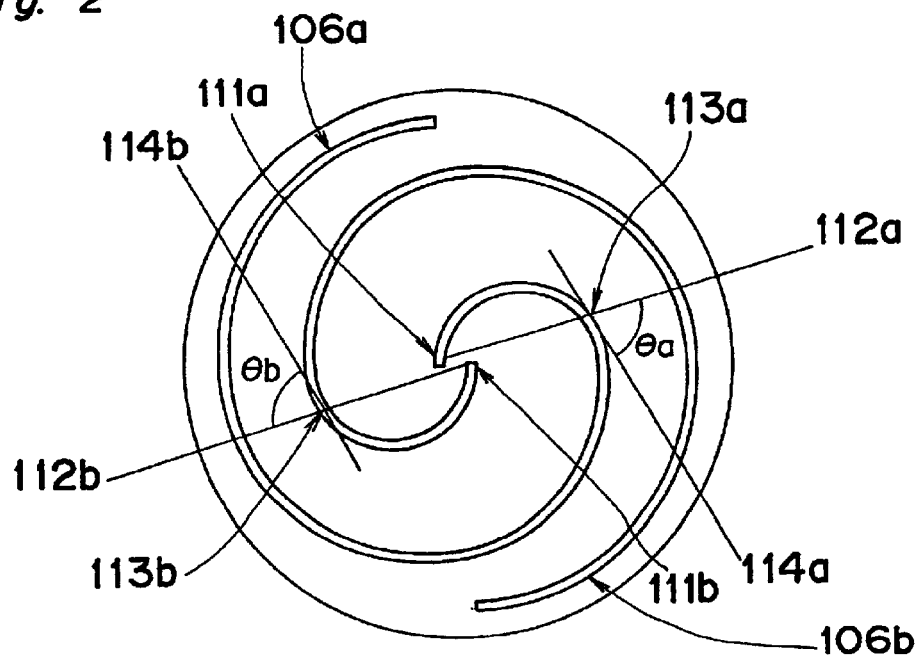
FIG. 2 is a plan view of a conductor in the first embodiment of the invention.

FIG. 2 shows a plan view of the conductors. A length of the first conductor 106a is approximately a quarter of the wavelength (3000 mm) of the high-frequency power, 750 mm. Similarly, a length of the second conductor 106b is approximately a quarter of the wavelength (3000 mm) of the high-frequency power, 750 mm. Also, at an intersecting point 113a, a straight line 112a passes through the center-side end portion 111a of the vortex formed by the first conductor 106a and crosses the first conductor 106a on a plane on which the first conductor 106a is laid down. An angle θa is formed by a tangential line 114a of the first conductor 106a at the location where the straight line 112a crosses the first conductor 106a and the straight line 112a and becomes generally constant all over the first conductor 106a. Similarly, at an intersecting point 113b a straight line 112b passes through the center-side end portion 111b of the vortex formed by the second conductor 106b crosses the second conductor 106b on a plane on which the second conductor 106b is laid down. An angle θb is formed by a tangential line 114b of the second conductor 106b at the location where the straight line 112b crosses the second conductor 106b and the straight line 112b and becomes generally constant all over the second conductor 106b.

Figure 3:
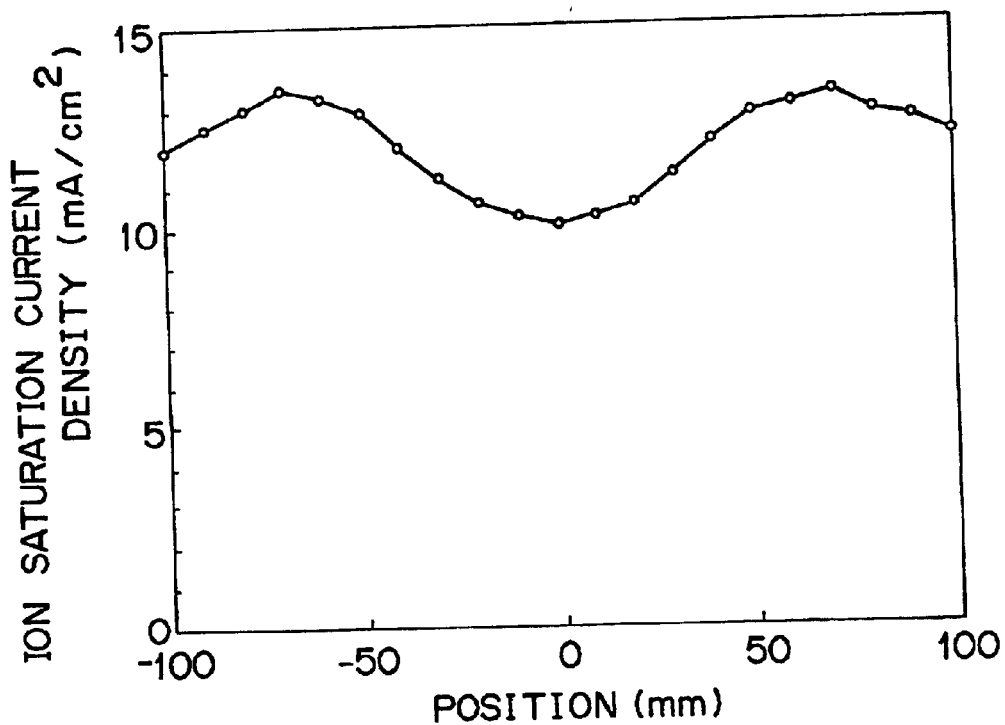
FIG. 3 is a view showing measurement results of ion saturation current density in the first embodiment of the invention.
Figure 4:
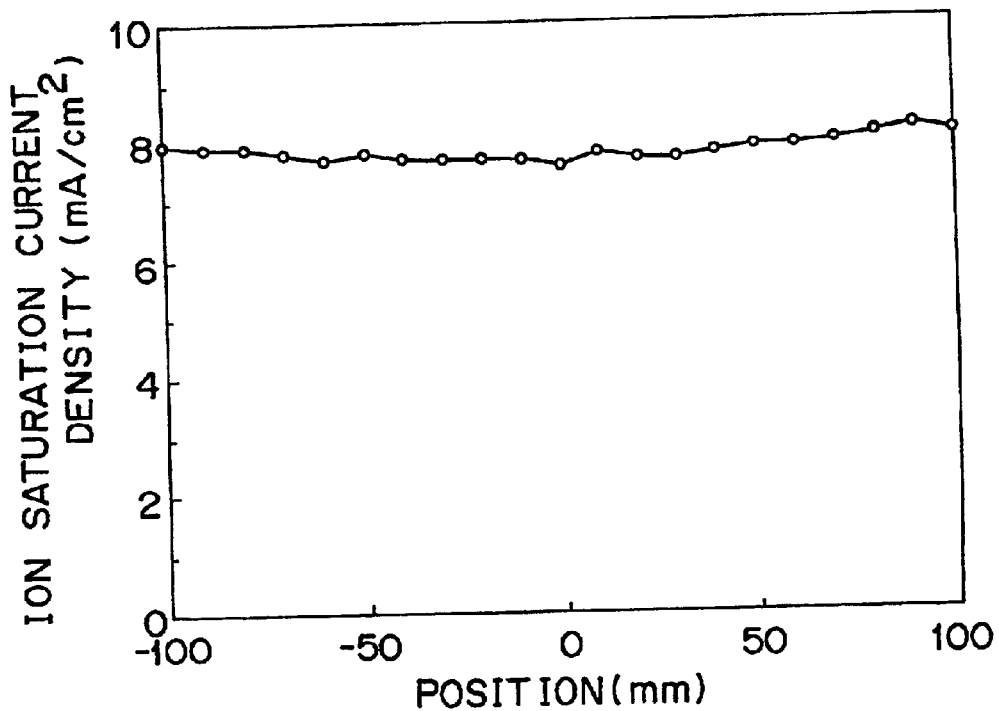
FIG. 4 is a view showing measurement results of ion saturation current density in the first embodiment of the invention.

FIG. 3 shows the results of measuring the ion saturation current density within a plane parallel to the substrate surface at a distance 80 mm away from the substrate surface by using the Langmuir probe method under the condition that, with a gas was selected and its flow rate and pressure were set to Ar=30 sccm and 1 Pa, respectfully, the plasma is generated by supplying a 1000 W high-frequency power of 100 MHz to the first conductor 106a. Likewise, FIG. 4 shows the results of measuring the ion saturation current density within a plane parallel to the substrate surface at a distance 10 mm away from the substrate surface. From FIG. 3, it can be understood that the ion saturation current density distribution within the plane parallel to the substrate surface at a distance 80 mm away from the substrate surface has a ring-shaped high density portion. The plasma is transported by diffusion, having an extremely uniform distribution in proximity to the substrate, as shown in FIG. 4. In other words, in order to obtain uniform plasma in proximity to the substrate, it is necessary for the ion saturation current density distribution to have ring-shaped high density portions at a distance sufficiently away from the substrate surface as in FIG. 3. As a result of performing experiments with the shape of the conductor being changed in various ways, it was found that uniform plasma can be obtained in proximity to the substrate when the ion saturation current density within the plane parallel to the substrate surface at a distance 50 mm or more away from the substrate surface has a ring-shaped high density portion.

Figure 5:
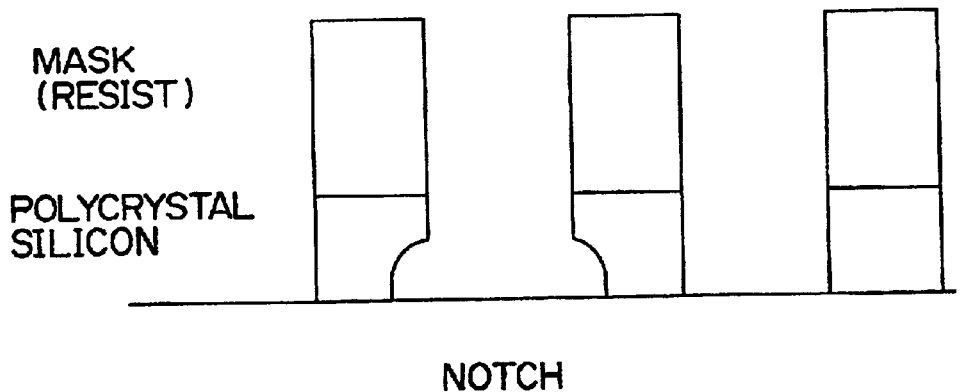
FIG. 5 is a view showing etching results in the first embodiment of the invention.

An 8 inch diameter silicon substrate 108 with a 300 nm thick polycrystal silicon film was placed on the electrode 107, the gas was selected and its flow rate and pressure were set to $Cl_2$=100 sccm and 1 Pa, respectively, and a 1000 W high-frequency power of 100 MHz (continuous wave) was supplied to the first conductor 106a, while a 15 W high-frequency power of 500 kHz was supplied to the electrode 107. As a result of this, the polycrystal silicon film was etched and an etching rate of 310 nm/min was obtained. However, as shown in FIG. 5, notches occurred. Also, by evaluating the plasma generated under these conditions with the Langmuir probe method, the electron temperature in proximity to the substrate was found to be 2.5 eV.

Figure 6:
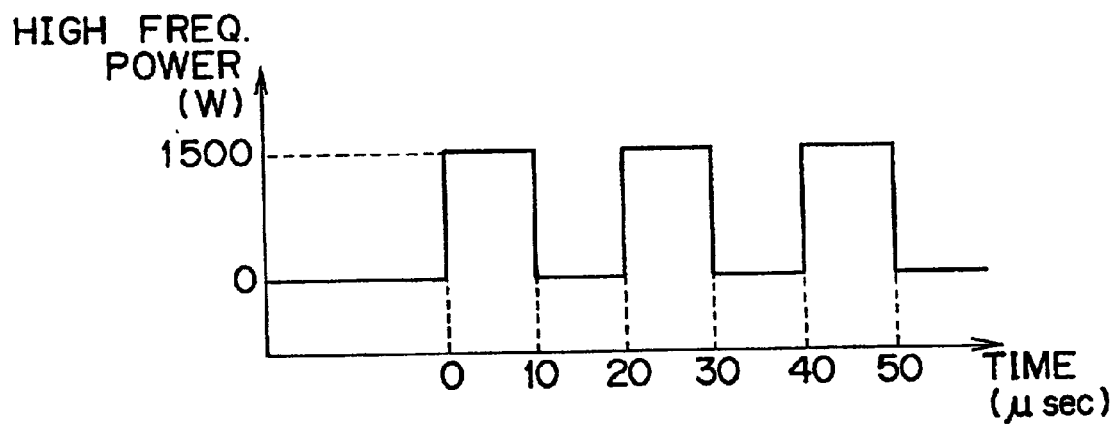
FIG. 6 is a view showing pulse modulation in the first embodiment of the invention.
Figure 7:
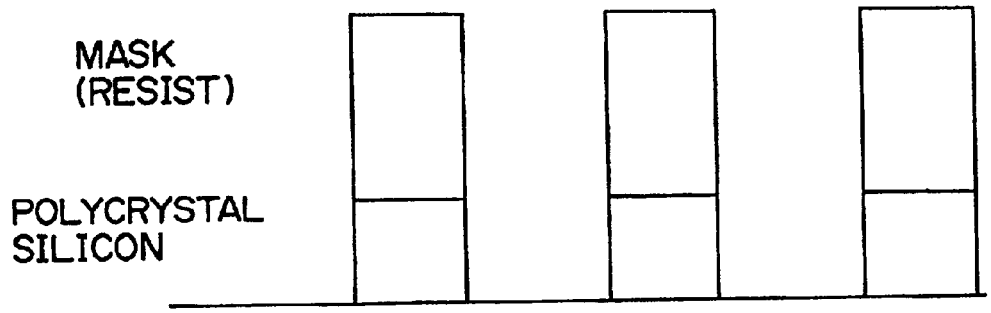
FIG. 7 is a view showing etching results in the first embodiment of the invention.

Then, the high-frequency power supplied to the first conductor 106a was modulated in a pulse-like fashion so that the time for the maximum value 1500 W would be 10 μsec and the time for the minimum value 0 W would be 10 μsec as shown in FIG. 6, while the other conditions were the same as in the continuous wave. As a result, the polycrystal silicon film was etched and an etching rate of 320 nm/min was obtained, resulting in a high precision etching without causing notches, as shown in FIG. 7, was realized. Also, by evaluating the plasma generated under these conditions with the Langmuir probe method, the electron temperature in proximity to the substrate found to be 1.8 eV. In addition, reflected-wave power was not more than 1% of the maximum value 1500 W of the traveling-wave power. The reason why a large reflected wave as occurs in the conventional ICP does not occur in the present invention is because a sufficient matching can be obtained for frequency components other than the fundamental harmonic wave (100 MHz) that are generated with pulse modulation, on the grounds that the Quality Factor Q, when the range of from the matching circuit 110 to the first conductor and the second conductor is taken as one load, is small with the result of a wide-band load. Therefore, reproducibility of processing rate and other processing results can be easily obtained, which leads to an excellent practicability.

It is noted that the high-frequency power is not necessarily modulated in a pulse-like fashion. Also, with the use of a continuous wave, if the etching rate of the mask (resist) is permitted to increase, setting the high-frequency power supplied to the electrode 107 to 20 to 30 W can prevent the occurrence of notches.

Figure 8:
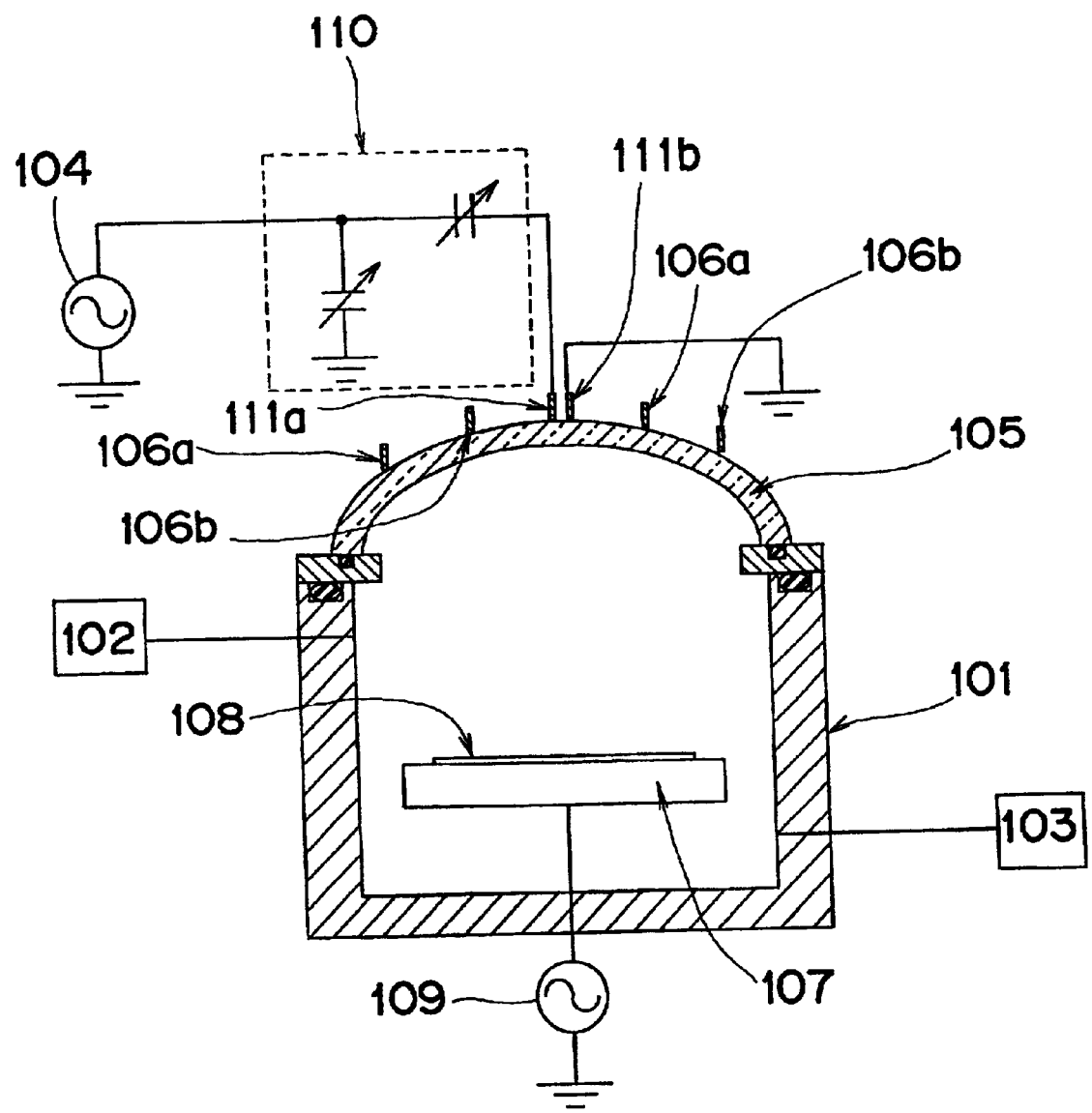
FIG. 8 is a cross-sectional view showing the arrangement of a plasma processing apparatus used in a second embodiment of the invention.

Next, a second embodiment of the present invention is described with reference to FIG. 8. FIG. 8 shows a cross-sectional view of a plasma processing apparatus used in the second embodiment of the invention. Referring to FIG. 8, while an interior of a vacuum chamber 101 is held at a specified pressure by simultaneously effecting exhaustion with a pump 103 and introduction of specified gas from a gas supply unit 102 into the vacuum chamber 101, a high-frequency power of 100 MHz is supplied by a high-frequency power source 104 to a first conductor 106a placed on a dielectric 105, and a second conductor 106b is grounded, by which plasma is generated in the vacuum chamber 101, enabling plasma processing such as etching, deposition and surface reforming to be achieved on a substrate 108 placed on an electrode 107. For achieving this plasma processing, a center-side end portion 111a of a vortex formed by the first conductor 106a is connected to the hot side of the high-frequency power. Also, a center-side end portion 111b of a vortex formed by the second conductor 106b is grounded. The first and second conductors 106a, 106b are dome shaped and of vortex type, their respective outer ends being opened. The first conductor 106a and the second conductor 106b are made of copper, and are arranged so as to form a multiple vortex. A high-frequency power source 109 dedicated to the electrode 107 and functioning to supply high-frequency power to the electrode 107 is provided so that ion energy that reaches the substrate 108 can be controlled. For impedance matching, a matching circuit 110 comprising two variable capacitors is provided between the high-frequency power source 104 and the first conductor 106a. Further, the high-frequency power source 104 is capable of modulating high-frequency power in a pulse-like fashion.

It should be noted that the plasma processing apparatus used in the second embodiment of the invention employs a plasma source essentially different from that of the ICP etching equipment of the prior art as described in FIG. 18, and similar to the plasma processing apparatus used in the first embodiment of the invention.

A length of the first conductor 106a is approximately a quarter of the wavelength (3000 mm) of the high-frequency power, 750 mm. Similarly, a length of the second conductor 106b is approximately a quarter of the wavelength (3000 mm) of the high-frequency power, 750 mm.

Assuming projected images of the first conductor and the second conductor onto a plane parallel to the substrate, the plane results in one similar to that of FIG. 2. That is, at an intersecting point 113a on the aforementioned plane, a straight line 112a passes through the center-side end portion 111a of the vortex formed by the projected image of the first conductor 106a and crosses the projected image of the first conductor 106a. An angle θa is formed by a tangential line 114a of the projected image of the first conductor 106a at the location where the straight line 112a crosses the first conductor 106a and the straight line 112a and becomes generally constant all over the projected image of the first conductor 106a. Similarly, at an intersection point 113b on the aforementioned plane, a straight line 112b passes through the center-side end portion 111b of the vortex formed by the projected image of the second conductor 106b crosses the projected image of the second conductor 106b. An angle θb is formed by a tangential line 114b of the projected image of the second conductor 106b at the location where the straight line 112b crosses the second conductor 106b and the straight line 112b and becomes generally constant all over the projected image of the second conductor 106b.

An 8 inch diameter silicon substrate 108 with a 200 nm thick tungsten silicide film was placed on the electrode 107, the gas was selected and its flow rate and pressure were set to $Cl_2$=150 sccm and 1.5 Pa, respectively, and a 1000 W high-frequency power of 100 MHz (continuous wave) was supplied to the first conductor 106a, while a 25 W high-frequency power of 500 kHz was supplied to the electrode 107. As a result of this, the tungsten silicide film was etched and an etching rate of 280 nm/min was obtained.

When the first conductor 106a and the second conductor 106b are dome shaped, making the dielectric 105 correspondingly dome-shaped allows for an easier reduction in the thickness of the dielectric required to hold the vacuum so that the coupling state between the conductor and the plasma is improved. Thus, plasma can be generated more efficiently. As a matter of course, it is also possible to generate plasma even in combination of a plane conductor and a dome-shaped dielectric or combination of a dome-shaped conductor and a plane dielectric.

The above embodiments of the invention have been described where the frequency of the high-frequency power supplied to the first conductor is 100 MHz. However, the frequency is not limited to this, the plasma processing method and apparatus of the present invention are effective, particularly in a frequency range of 50 MHz to 150 MHz. By using a frequency not lower than 50 MHz, it becomes possible to set the electron temperature to 3 eV or lower for continuous-wave plasma or to set the electron temperature to 2 eV or lower for pulse-modulation plasma, and to suppress the reflected-wave power to under a few % of the traveling-wave power. Further, with frequency not higher than 150 MHz, plasma can be generated by a 2 Pa or lower pressure, while no stub is needed to obtain impedance matching. However, with the use of a frequency lower than 50 MHz or higher than 150 MHz, it is also possible to employ the conductor structure of the present invention.

Although the embodiments of the invention have been described where the pressure is 2 Pa or lower, the pressure is not necessarily required to be 2 Pa or lower. Further, although the embodiments of the invention have been described where the conductor is provided outside the vacuum chamber 101, the conductor may also be provided inside the vacuum chamber.

Although the embodiments of the invention have been described where the conductor is made of copper, the conductor may be other materials such as aluminum, stainless steel or the like.

Although the embodiments of the invention have been described above on the etching of polycrystal silicon film and the etching of tungsten silicide film, the present invention may be applied to plasma processing such as other types of etching, sputtering and CVD. In some cases these, high-frequency power does not need to be supplied to the electrode, but it is apparent that the present invention is also effective for this type of processing.

Although the embodiments of the invention have been described where the ratio of the maximum value to the minimum value of the high-frequency power is infinite in modulating the high-frequency power in a pulse-like fashion, a ratio of about 10 or more allows the electron temperature to be decreased to 2 eV or lower.

Although the embodiments of the invention have been described where the modulation cycle is 20 µsec (modulation frequency=50 kHz) in modulating the high-frequency power in a pulse-like fashion, the modulation frequency is not limited to this. Also, the ratio of the time lapse for which the maximum value of the high-frequency power is supplied, to the time lapse for which the minimum value of the high-frequency power is supplied (duty ratio) is not limited to 0.5 (50%).

Although the embodiments of the invention have been described where the length of each of the first conductor and the second conductor is approximately a quarter of the wavelength of the high-frequency power, yet the length may be some other length for the control of the electromagnetic-wave radiation pattern, matching state and efficiency. In particular, use of conductors having lengths of ¼, ½ or ⅝ of the wavelength of the high-frequency power allows for a successful matching state to be easily obtained.

Although the embodiments of the invention have been described where the high-frequency power is supplied to a center-side end portion of the vortex formed by the first conductor, the high-frequency power may also be supplied to the outer side one end, or any arbitrary position other than the end portions, of the first conductor. However, it may be difficult, in some of such cases, to obtain uniformity of the plasma.

Although the embodiments of the invention have been described where the center-side end portion of the vortex formed by the second conductor is grounded, the outer end portion, or any arbitrary position other than the end portions, of the second conductor may also be grounded.

Although the embodiments of the invention have been described where the second conductor whose one end is grounded is used, it is possible to generate the plasma even without using the second conductor. Such a form can be regarded as being included in the scope of the invention.

The embodiments of the invention have been described where, at an intersecting point, a straight line passes through the center-side end portion of the vortex formed by the first conductor and crosses the first conductor on a plane on which the first conductor is laid down. An angle is formed by a tangential line of the first conductor and the straight line and is generally constant all over the first conductor; and at an intersecting point, a straight line passes through the center-side end portion of the vortex formed by the second conductor and crosses the second conductor on a plane on which the second conductor is laid down. An angle is formed by a tangential line of the second conductor and the straight line and is generally constant all over the second conductor (a case where a substantially plane conductor is used).

In another case where, assuming projected images of the first conductor and the second conductor onto a plane parallel to the substrate, at an intersecting point on the aforementioned plane, a straight line passes through the center-side end portion of the vortex formed by the projected image of the first conductor and crosses the projected image of the first conductor. An angle is formed by a tangential line of the projected image of the first conductor and the straight line and is generally constant all over the projected image of the first conductor; and at an intersecting point on the aforementioned plane, a straight line passes through the center-side end portion of the vortex formed by the projected image of the second conductor and crosses the projected image of the second conductor. An angle formed by a tangential line of the projected image of the second conductor and the straight line and is generally constant all over the projected image of the second conductor (a case where a dome-shaped conductor is used). However, these conditions do not necessarily need to be satisfied. Notwithstanding, when these conditions are satisfied, a successful matching state can be easily obtained owing to a small reactance component of the impedance of the first conductor.

As apparent from the foregoing description, as claimed in the first aspect of the invention, there is provided a plasma processing method for processing a substrate placed on an electrode within a vacuum chamber by generating plasma in the vacuum chamber through steps of: controlling a pressure of an interior of a vacuum chamber to a specified pressure by exhausting the interior of the vacuum chamber while supplying a gas into the vacuum chamber; and, while controlling the pressure of the interior of the vacuum chamber, supplying high-frequency power to a conductor used for radiating electromagnetic waves into the vacuum chamber, wherein an ion saturation current density distribution within a plane parallel to a substrate surface in a space distant from the substrate surface by a specified distance has a ring-shaped high density portion. Thus, highly uniform, low-electron-temperature plasma can be obtained in proximity to the substrate under a low pressure, so that plasma processing of high precision can be achieved.

Also, as claimed in the second aspect of the invention, there is provided a plasma processing method for processing a substrate placed on an electrode within a vacuum chamber by generating plasma in the vacuum chamber, the plasma being generated by radiating electromagnetic waves into the vacuum chamber through steps of: controlling a pressure of an interior of the vacuum chamber to a specified pressure by exhausting the interior of the vacuum chamber while supplying a gas into the vacuum chamber; and, while controlling the pressure of the interior of the vacuum chamber, supplying high-frequency power to one end of a first conductor which is opened at another end and which is substantially flat shaped and of vortex type and grounding one end of a second conductor which is opened at another end and which is substantially flat shaped and of vortex type. Thus, low-electron-temperature plasma can be obtained under a low pressure, so that plasma processing of high precision can be achieved.

Also, as claimed in the third aspect of the invention, there is provided a plasma processing method for processing a substrate placed on an electrode within a vacuum chamber by generating plasma in the vacuum chamber, the plasma being generated by radiating electromagnetic waves into the vacuum chamber through steps of: controlling a pressure of an interior of the vacuum chamber to a specified pressure by exhausting the interior of the vacuum chamber while supplying a gas into the vacuum chamber; and, while controlling the pressure control of the interior of the vacuum chamber, supplying high-frequency power to one end of a first conductor which is opened at another end and which is dome shaped and of vortex type and grounding one end of a second conductor which is opened at another end and which is dome shaped and of vortex type. Thus, low-electron-temperature plasma can be obtained under a low pressure, so that plasma processing of high precision can be achieved.

Also, as claimed in the fourth aspect of the invention, there is provided a plasma processing apparatus comprising: means for supplying a gas into an interior of a vacuum chamber; means for exhausting the interior of the vacuum chamber; an electrode for placing a substrate thereon; and a dielectric, by further comprising: a conductor for radiating electromagnetic waves into the vacuum chamber via the dielectric in order to generate plasma having a ring-shaped high density portion within a plane parallel to a surface of the substrate placed on the electrode in a space distant from the substrate surface by a specified distance; and a high-frequency power source capable of supplying high-frequency power to the conductor. Thus, uniform, low-electron-temperature plasma can be obtained in proximity to the substrate under a low pressure, so that plasma processing of high precision can be achieved.

Also, as claimed in the fifth aspect of the invention, there is provided a plasma processing apparatus comprising: means for supplying a gas into an interior of a vacuum chamber; means for exhausting the interior of the vacuum chamber; a high-frequency power source capable of supplying high-frequency power; an electrode for placing a substrate thereon; and a dielectric, comprising: a first conductor which has one end opened and another end connected to a hot side of the high-frequency power and which is substantially flat shaped and of vortex type, and a second conductor which has one end opened and another end grounded and which is substantially flat shaped and of vortex type. Thus, low-electron-temperature plasma can be obtained under a low pressure, so that plasma processing of high precision can be achieved.

Also, as claimed in the sixth aspect of the invention, there is provided a plasma processing apparatus comprising: means for supplying a gas into an interior of a vacuum chamber; means for exhausting the interior of the vacuum chamber; a high-frequency power source capable of supplying high-frequency power; an electrode for placing a substrate thereon; and a dielectric, comprising: a first conductor which has one end opened and another end connected to a hot side of the high-frequency power and which is substantially dome shaped and of vortex type, and a second conductor which has one end opened and another end grounded and which is substantially dome shaped and of vortex type. Thus, low-electron-temperature plasma can be obtained under a low pressure, so that plasma processing of high precision can be achieved.

Figure 9A:
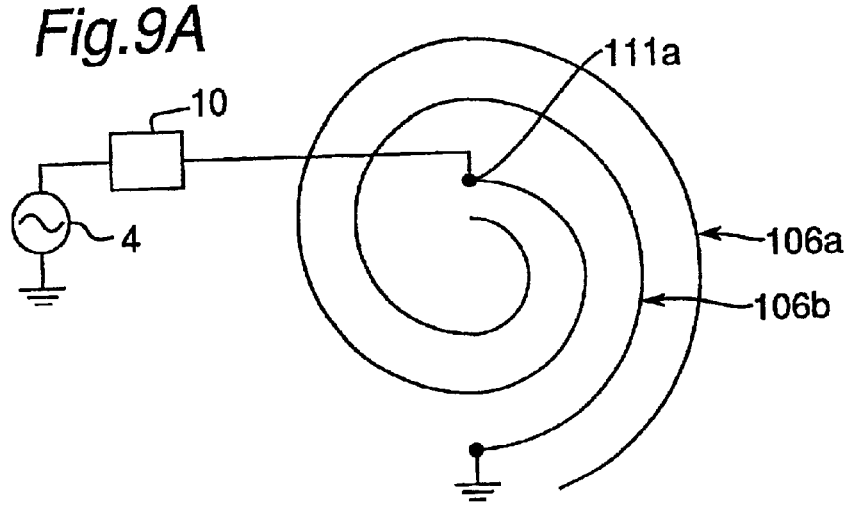
FIG. 9A is a plan view of the conductor in a modification of the first embodiment of the invention.
Figure 9B:
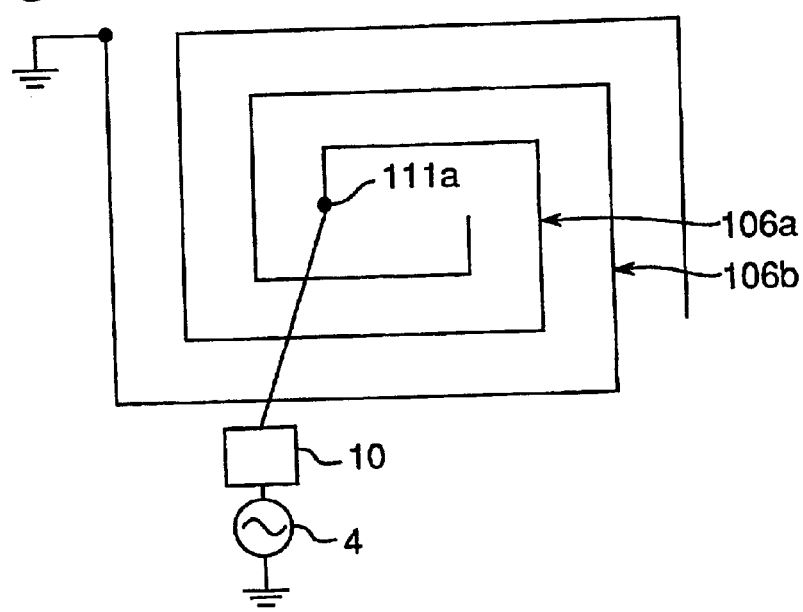
FIG. 9B is a plan view of the conductor in another modification of the first embodiment of the invention where a part of one vortex is removed therefrom and divided into two vortexes.
Figure 9C:
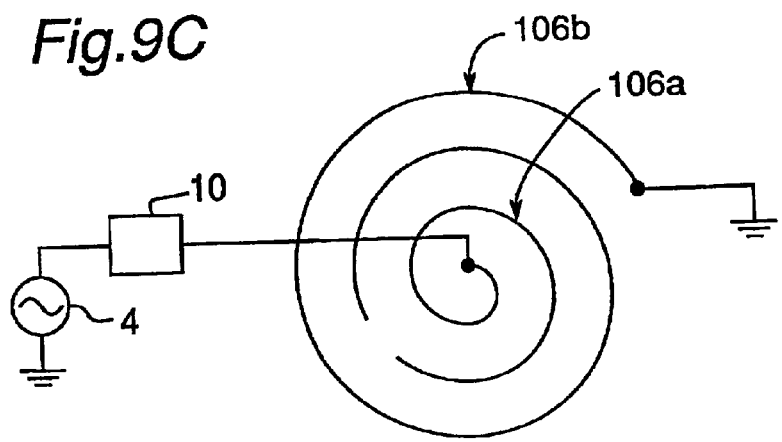
FIG. 9C is a plan view of the conductor in another modification of the first embodiment of the invention which can be applied to a rectangular substrate used for a liquid crystal panel.

The shape of the vortex is not limited to the above shape, but can be formed in any shape as follows. FIG. 9A is a plan view of the conductor in a modification of the first embodiment of the invention where the vortexes of the first and second conductors 106a, 106b are formed in the same direction. FIG. 9C is a plan view of the conductor in another modification of the first embodiment of the invention where a part of one vortex is removed therefrom and divided into two vortexes, the first and second vortexes. FIG. 9B is a plan view of the conductor in another modification of the first embodiment of the invention which can be applied to a rectangular substrate used for a liquid crystal panel, where the shape of the vortex is nearly rectangular.

Figure 10:
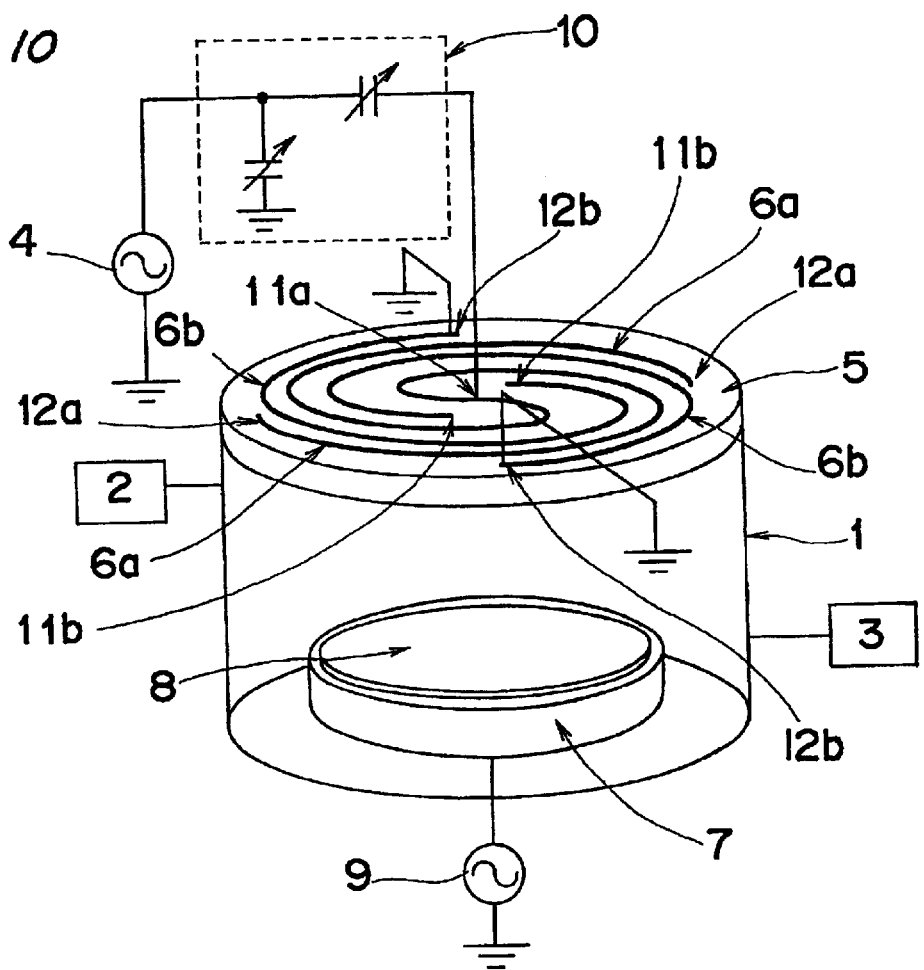
FIG. 10 is a perspective view showing a plasma processing apparatus used in a third embodiment of the invention.

Below, a third embodiment of the present invention is described with reference to FIGS. 10 through 14. FIG. 10 shows a perspective view of a plasma processing apparatus used in the third embodiment of the invention. Referring to FIG. 10, while an interior of a vacuum chamber 1 is held at a specified pressure by simultaneously effecting exhaustion with a pump 3 and introduction of specified gas from a gas supply unit 2 into the vacuum chamber 1, a high-frequency power of 100 MHz is supplied by a high-frequency power source 4 to a substantially center portion 11a of a first conductor 6a placed on a dielectric 5, by which plasma is generated in the vacuum chamber 1, enabling plasma processing such as etching, deposition, or surface reforming to be achieved on a substrate 8 placed on an electrode 7. The first conductor 6a has outer-peripheral end portions opened and forms a multiple vortex comprising a plurality of substantially plane, vortex-type first conductor members with their substantially center portions 11a electrically connected to one another. Also, a substantially center portion 11a of the first conductor 6a is connected to a hot side of the high-frequency power. A second conductor comprising a plurality of substantially plane, vortex shaped second conductor members 6B. End portions 11b near the center portion of the second conductor members 6b are opened without being connected to each other, while outer-peripheral end portions 12b of the second conductor members 6b are grounded. The first conductor 6a and the second conductor 6b are made of copper, and arranged so that multiple vortices formed by the second conductor are sandwiched between multiple vortices formed by the first conductor 6a. A high-frequency power source 9 dedicated to the electrode 7 and functioning to supply high-frequency power to the electrode 7 is provided so that ion energy that reaches the substrate 8 can be controlled. For impedance matching, a matching circuit 10 comprising two variable capacitors is provided between the high-frequency power source 4 and the first conductor 6a. The high-frequency power source 4 is capable of modulating high-frequency power in a pulse-like fashion.

It should be noted that the plasma processing apparatus used in the third embodiment of the invention employs a plasma source essentially different from that of the ICP etching equipment of the prior art as described in FIG. 18. In more detail, one end of a coil 26 is grounded in the prior art example shown in FIG. 18, whereas the outer-peripheral end portions 12a of the first conductor 6a are opened in the third embodiment of the invention. For this reason, in the prior art example shown in FIG. 18, a current flowing through the coil 26 is nearly constant in any portion of the coil 26, and electrons are accelerated by a high-frequency electric field induced by a high-frequency magnetic field formed in a vacuum chamber 21 by the aforementioned current. By contrast, in the third embodiment of the invention, a voltage standing wave and a current standing wave occur from the first conductor 6a and the second conductor 6b, and electromagnetic waves radiated into the vacuum chamber 1 by these standing waves serve to cause the acceleration of electrons. Accordingly, the first conductor 6a and the second conductor 6b used in the third embodiment of the invention, although being of vortex type, should not be called coils but could appropriately be called antennas. However, because there are some cases in which coils in the ICP system are called "antennas", as in Unexamined Japanese Laid-Open Patent Publication No. 7-106316, the description herein will be made without using the term, "antennas", for the avoidance of confusion.

Figure 11:
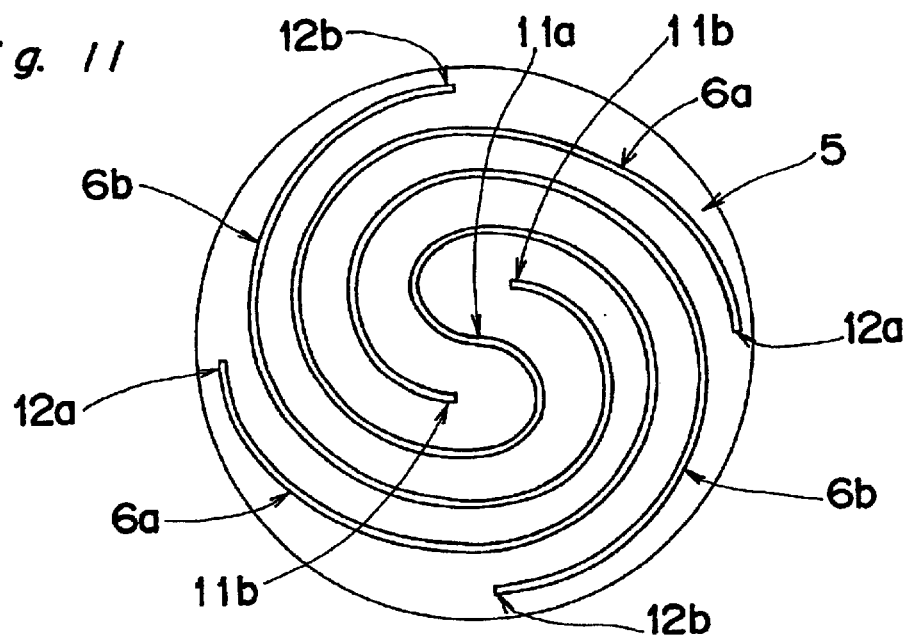
FIG. 11 is a plan view of a conductor in the third embodiment of the invention.

FIG. 11 shows a plan view of the conductors. A length of the first conductor 6a is approximately a quarter of the wavelength (3000 mm) of the high-frequency power, 750 mm. Similarly, a length of the second conductor 6b is approximately a quarter of the wavelength (3000 mm) of the high-frequency power, 750 mm.

Figure 12:
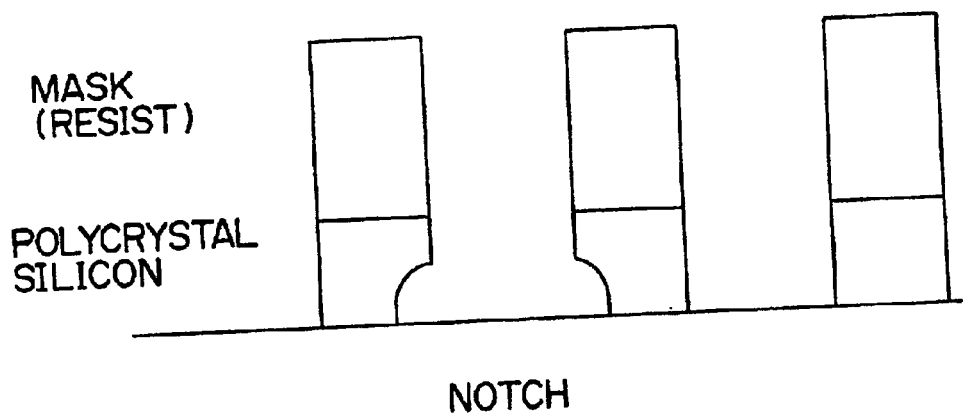
FIG. 12 is a view showing etching results in the third embodiment of the invention.

An 8 inch diameter silicon substrate 8 with a 300 nm thick polycrystal silicon film was placed on the electrode 7, the gas was selected and its flow rate and pressure were set to $Cl_2$=100 sccm and 1 Pa, respectively, and a 1000 W high-frequency power of 100 MHz (continuous wave) was supplied to the first conductor 6a, while a 15 W high-frequency power of 500 kHz was supplied to the electrode 7. As a result of this, the polycrystal silicon film was etched and an etching rate of 300 nm/min was obtained. Although notches occurred under these conditions as shown in FIG. 12, the number of notches was small as compared with the case where the processing was performed under similar etching conditions with the conventional ICP etching equipment as shown in FIG. 18. Also, by evaluating the plasma generated under these conditions with the Langmuir probe method, the electron temperature in proximity to the substrate found to be 2.5 eV.

Figure 13:
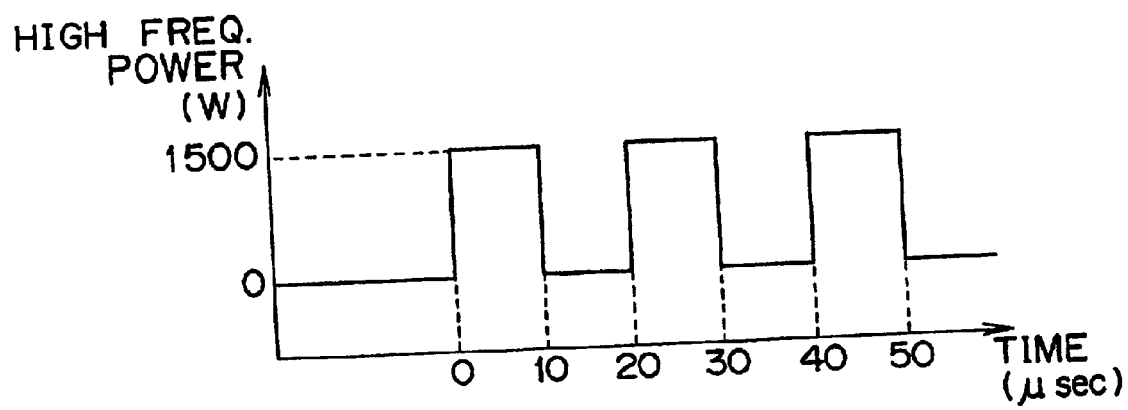
FIG. 13 is a view showing pulse modulation in the third embodiment of the invention.
Figure 14:
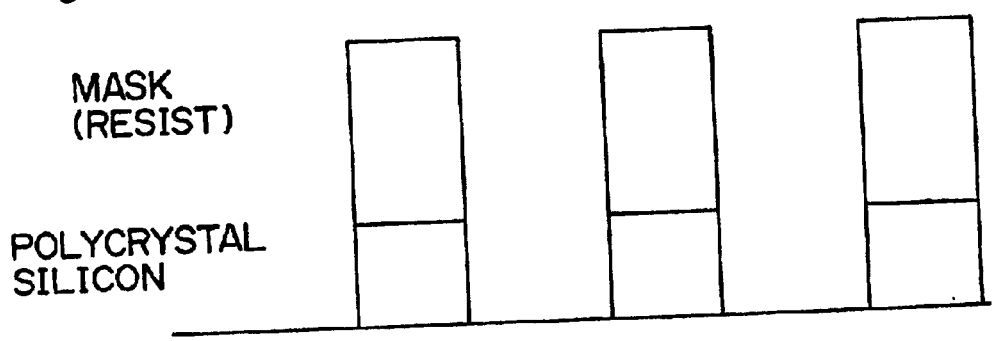
FIG. 14 is a view showing etching results in the third embodiment of the invention.

Then, the high-frequency power supplied to the first conductor 6a was modulated in a pulse-like fashion so that the time for the maximum value 1500 W would be 10 μsec and the time for the minimum value 0 W would be 10 μsec as shown in FIG. 13, while the other conditions were the same as in the continuous wave. As a result, the polycrystal silicon film was etched and an etching rate of 310 nm/min was obtained, resulting in a high precision etching without causing of notches, as shown in FIG. 14, was realized. Also, by evaluating the plasma generated under these conditions with the Langmuir probe method, the electron temperature in proximity to the substrate was found to be 1.8 eV. In addition, reflected-wave power was not more than 1% of the maximum value 1500 W of the traveling-wave power. The reason why a large reflected wave as occurs in the conventional ICP system does not occur in the present invention is because sufficient matching can be obtained even for frequency components equal to or other than the fundamental harmonic wave (100 MHz) that are generated with pulse modulation, on the grounds that a Quality Factor Q, as the range of from the matching circuit 10 to the first conductor and the second conductor is taken as one load, is small with the result of a wide-band load. Therefore, reproducibility of processing rate and other processing results can be easily obtained, which leads to an excellent practicability.

It is noted that the high-frequency power is not necessarily modulated in a pulse-like fashion. Also, with the use of a continuous wave, if the etching rate of the mask (resist) is permitted to increase, setting the high-frequency power supplied to the electrode 7 to 20 to 30 W can prevent the occurrence of notches.

Figure 15:
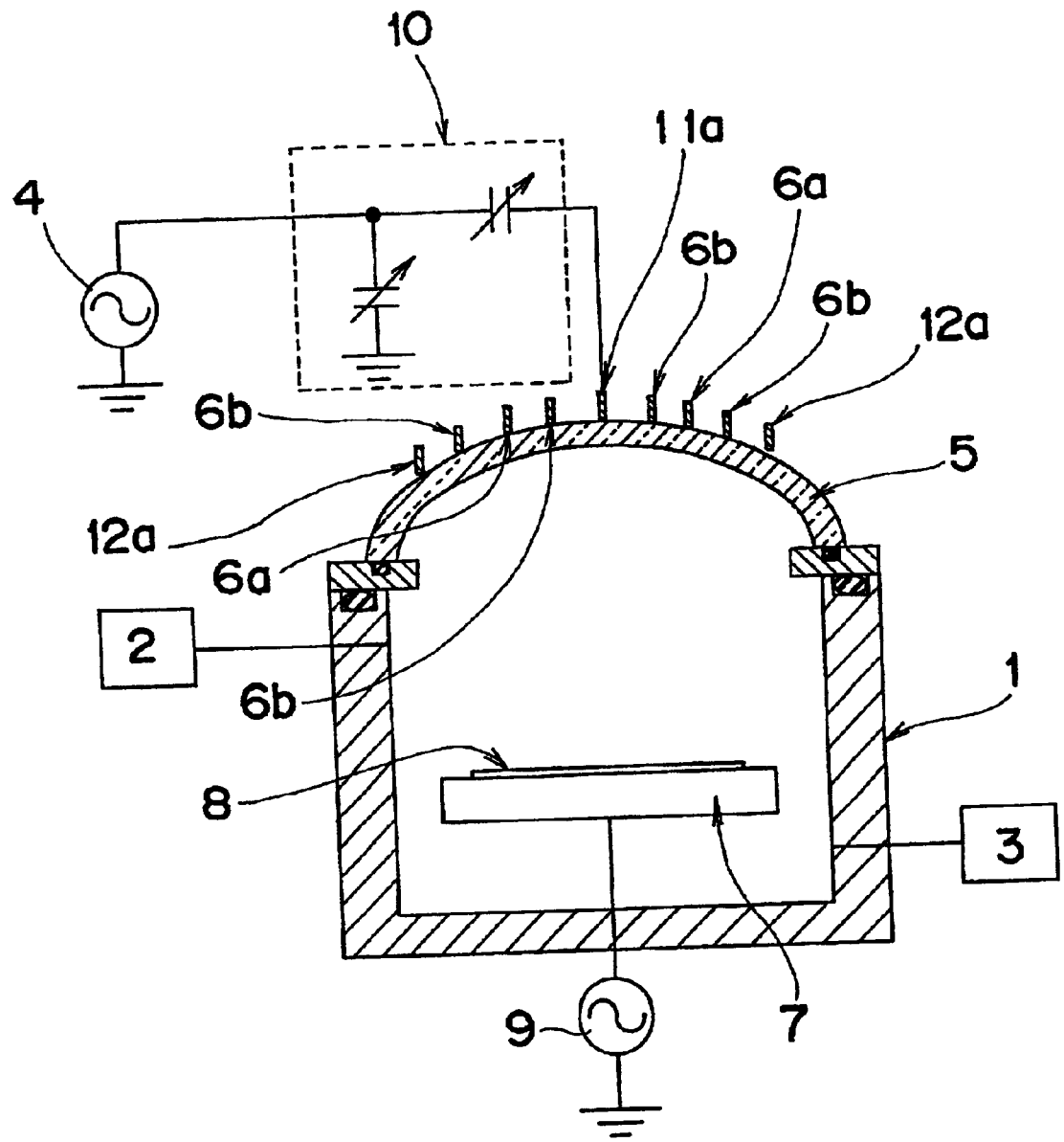
FIG. 15 is a cross-sectional view showing the arrangement of a plasma processing apparatus used in a fourth embodiment of the invention.

Next, a fourth embodiment of the present invention is described with reference to FIG. 15. FIG. 15 shows a cross-sectional view of a plasma processing apparatus used in the fourth embodiment of the invention. Referring to FIG. 15, while an interior of a vacuum chamber 1 is held at a specified pressure by simultaneously effecting exhaustion with a pump 3 and introduction of specified gas from a gas supply unit 2 into the vacuum chamber 1, a high-frequency power of 100 MHz is supplied by a high-frequency power source 4 to a substantially center portion 11a of a first conductor 6a placed on a dielectric 5, by which plasma is generated in the vacuum chamber 1, enabling plasma processing such as etching, deposition, or surface reforming to be achieved on a substrate 8 placed on an electrode 7. The first conductor 6a has outer-peripheral end portions 12a opened and forms a multiple vortex comprising a plurality of dome-shaped, vortex conductor members with their substantially center portions 11a electrically connected to one another. Also, a substantially center portion 11a of the first conductor 6a is connected to a hot side of the high-frequency power. A second conductor comprises a plurality of dome shaped vortex shaped second conductor members 6b. End portions 11b near the center portion of the second conductor members 6b are opened without being connected to each other, while outer-peripheral end portions 12b of the second conductor members 6b are grounded. The first conductor 6a and the second conductor are made of copper, and arranged so that multiple vortices formed by the second conductor are sandwiched between multiple vortices formed by the first conductor 6a. In addition, projected images of the first conductor 6a and the second conductor onto a plane parallel to the substrate 8 are similar to those of FIG. 11. A high-frequency power source 9 dedicated to the electrode 7 and functioning to supply high-frequency power to the electrode 7 is provided so that ion energy that reaches the substrate 8 can be controlled. For impedance matching, a matching circuit 10 comprising two variable capacitors is provided between the high-frequency power source 4 and the first conductor 6a. The high-frequency power source 4 is capable of modulating high-frequency power in a pulse-like fashion.

It should be noted that the plasma processing apparatus used in the fourth embodiment of the invention employs a plasma source essentially different from that of the ICP etching equipment of the prior art as described in FIG. 18, and similar to the plasma processing apparatus used in the third embodiment of the invention.

A length of the first conductor 6a is approximately a quarter of the wavelength (3000 mm) of the high-frequency power, 750 mm. Similarly, a length of the second conductor 6b is approximately a quarter of the wavelength (3000 mm) of the high-frequency power, 750 mm.

An 8 inch diameter silicon substrate 8 with a 200 nm thick tungsten silicide film was placed on the electrode 7, the gas was selected and its flow rate and pressure were set to $Cl_2$=150 sccm and 1.5 Pa, respectively, and a 1000 W high-frequency power of 100 MHz (continuous wave) was supplied to the first conductor 6a, while a 25 W high-frequency power of 500 kHz was supplied to the electrode 7. As a result of this, the tungsten silicide film was etched and an etching rate of 270 nm/min was obtained.

When the first conductor 6a and the second conductor 6b are dome-shaped, making the dielectric 5 correspondingly dome-shaped allows for an easier reduction in the thickness of the dielectric 5 required to hold the vacuum so that the coupling state between the conductor and the plasma is improved. Thus, plasma can be generated more efficiently. As a matter of course, it is also possible to generate plasma even in combination of a plane conductor and a dome-shaped dielectric or combination of a dome-shaped conductor and a plane dielectric.

Figure 16:
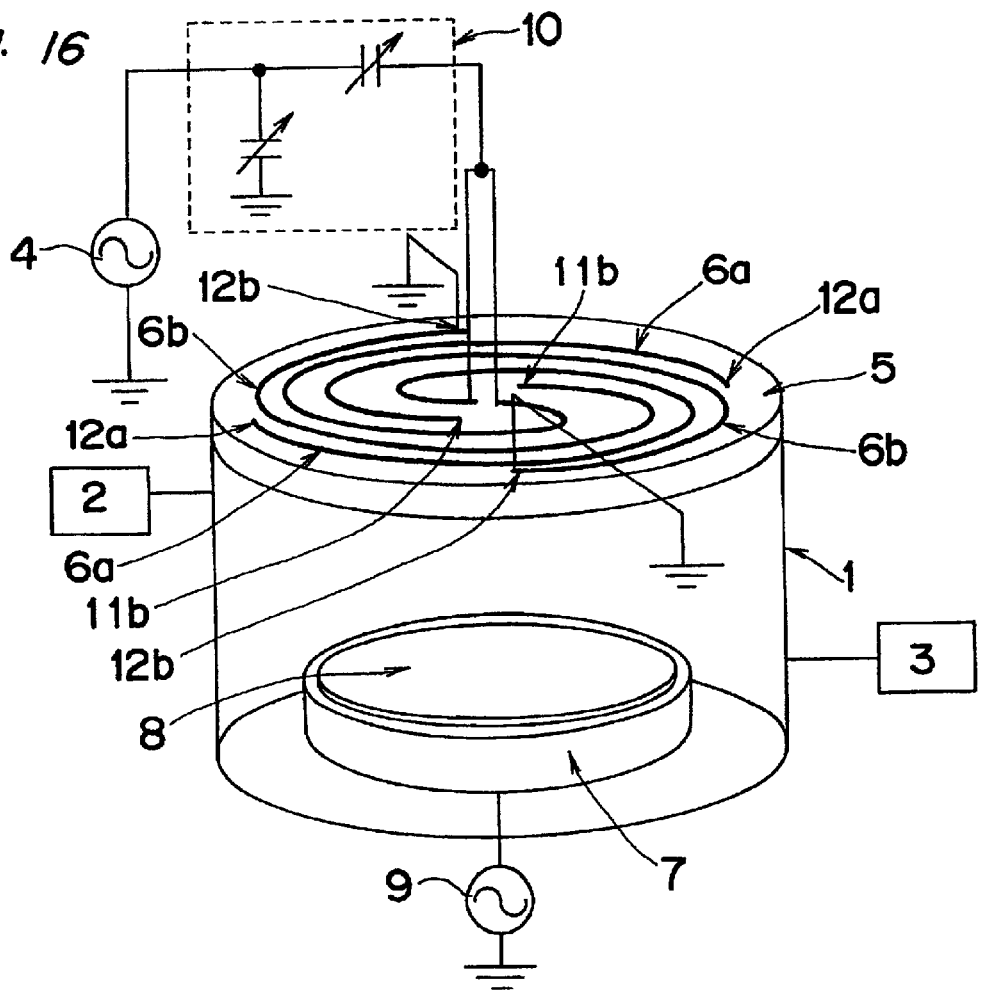
FIG. 16 is a perspective view showing the arrangement of a plasma processing apparatus used in another embodiment of the invention.

In addition, with regard to the first conductor 6a, it is only required that the substantially center portions 11a be electrically connected to one another. It is also possible that, for example as shown in FIG. 16, the hot side of the high-frequency power is branched at a point away from the first conductor.

Figure 17:
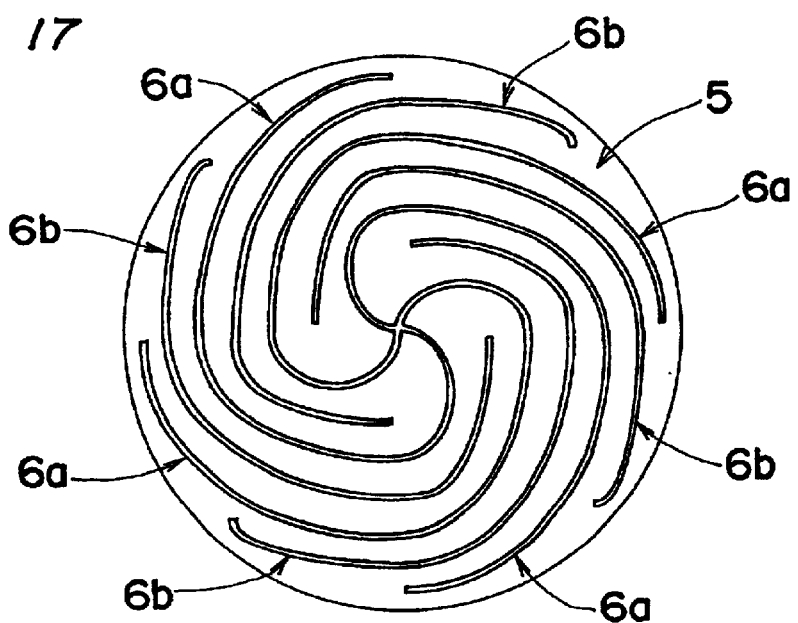
FIG. 17 is a plan view of a conductor used in another embodiment of the invention.

The above embodiments of the invention have been described where the first conductor and the second conductor are of the double vortex type (multiplicity=2). However, the multiplicity is not limited to 2 and any multiply may be selected. The more the multiplicity increases, the smaller the peripheral plasma distribution becomes so that more uniform plasma can be obtained. However, because changing the multiplicity would cause the impedance of the first conductor to change, a multiplicity that results in a successful matching should be selected. As an example in which the multiplicity is other than 2, FIG. 17 shows a plan view of the first conductor and the second conductor, where the multiplicity is 4. It is noted that the present invention has a novelty in that the first conductor is of a multiple-vortex type, showing superior characteristics in the uniformity of the plasma over the methods and apparatuses using simple vortex type conductors that have already been proposed.

The above embodiments of the invention have been described where the frequency of the high-frequency power supplied to the first conductor is 100 MHz. However, the frequency is not limited to this, the plasma processing method and apparatus of the present invention are effective, particularly in a frequency range of 50 MHz to 150 MHz. By using a frequency not lower than 50 MHz, it becomes possible to set the electron temperature to 3 eV or lower for continuous-wave plasma or to set the electron temperature to 2 eV or lower for pulse-modulation plasma, and to suppress the reflected-wave power to under a few percent of the traveling-wave power. Further, with frequency not higher than 150 MHz, plasma can be generated by a 2 Pa or lower pressure, while no stub is needed to obtain impedance matching. However, with the use of a frequency lower than 50 MHz or higher than 150 MHz, it is also possible to employ the conductor structure of the present invention.

Although the embodiments of the invention have been described where the pressure is 2 Pa or lower, the pressure is not necessarily required to be 2 Pa or lower.

Although the embodiments of the invention have been described where the conductor is provided outside the vacuum chamber, the conductor may also be provided inside the vacuum chamber. However, when the conductor is provided inside the vacuum chamber, impurities generated by a reaction between the conductor and plasma may be included in the substrate. Therefore, it is desirable to provide the conductor outside the vacuum chamber.

Although the embodiments of the invention have been described where the conductor is made of copper, the conductor may be other materials such as aluminum, stainless steel or the like.

Although the embodiments of the invention have been described above on the etching of polycrystal silicon film and the etching of tungsten silicide film, the present invention may be applied to other types of plasma processing such as other etching, sputtering and CVD. In some cases, high-frequency power does not need to be supplied to the electrode, but it is apparent that the present invention is also effective for this type of processing.

Although the embodiments of the invention have been described where the ratio of the maximum value to the minimum value of the high-frequency power is infinite in modulating the high-frequency power in a pulse-like fashion, a ratio of about 10 or more allows the electron temperature to be decreased to 2 eV or lower.

Although the embodiments of the invention have been described where the modulation cycle is 20 μsec (modulation frequency=50 kHz) in modulating the high-frequency power in a pulse-like fashion, the modulation frequency is not limited to this. Also, the ratio of the time lapse for which the maximum value of the high-frequency power is supplied, to a time lapse for which the minimum value of the high-frequency power is supplied (duty ratio) is not limited to 0.5 (50%).

Although the embodiments of the invention have been described where the length of each of the first conductor and the second conductor is approximately a quarter of the wavelength of the high-frequency power, the length may be some other length for the control of the electromagnetic-wave radiation pattern, matching state and efficiency. In particular, use of conductors having lengths of ¼, ½ or ⅝ of the wavelength of the high-frequency power allows for a successful matching state to be easily obtained.

Although the embodiments of the invention have been described using the second conductor whose one end is grounded, it is possible to generate plasma even without using the second conductor. Such a design can be regarded as being included in the scope of the invention.

As apparent from the foregoing description of the present invention, there is provided a plasma processing method comprising: controlling a pressure of an interior of a vacuum chamber to a specified pressure by exhausting the interior of the vacuum chamber while supplying a gas into the vacuum chamber; while controlling the pressure of the interior of the vacuum chamber, supplying high-frequency power to a substantially center portion of a first conductor which comprises a plurality of vortex-type conductors with their substantially center portions electrically connected to one another and outer-peripheral end portions opened to be of a multiple-vortex type; and generating plasma in the vacuum chamber and processing a substrate placed on an electrode within the vacuum chamber. Thus, highly uniform, low-electron-temperature plasma can be obtained under a low pressure, so that plasma processing of high precision can be achieved.

Also, according to the present invention, there is provided plasma processing apparatus comprising: a device for supplying a gas into an interior of a vacuum chamber; a device for exhausting the interior of the vacuum chamber; a high-frequency power source for supplying high-frequency power; an electrode for placing a substrate thereon; a dielectric; a multiple-vortex-type first conductor which has outer-peripheral end portions opened and which comprises a plurality of substantially plane or dome-shaped vortex-type conductors with their substantially center portions electrically connected to one another, a substantially center portion of the first conductor being connected to a hot side of the high-frequency power. Thus, highly uniform, low-electron-temperature plasma can be obtained under a low pressure, so that plasma processing of high precision can be achieved.

In the above-described embodiments, the angle θa is preferably nearly equal to or equal to the angle θb.

Since in the above embodiment in FIG. 10, the current flows in two different directions from the center-side end portion 11a of the vortex, the symmetry becomes excellent and the current amount can be reduced.

Figure 20:
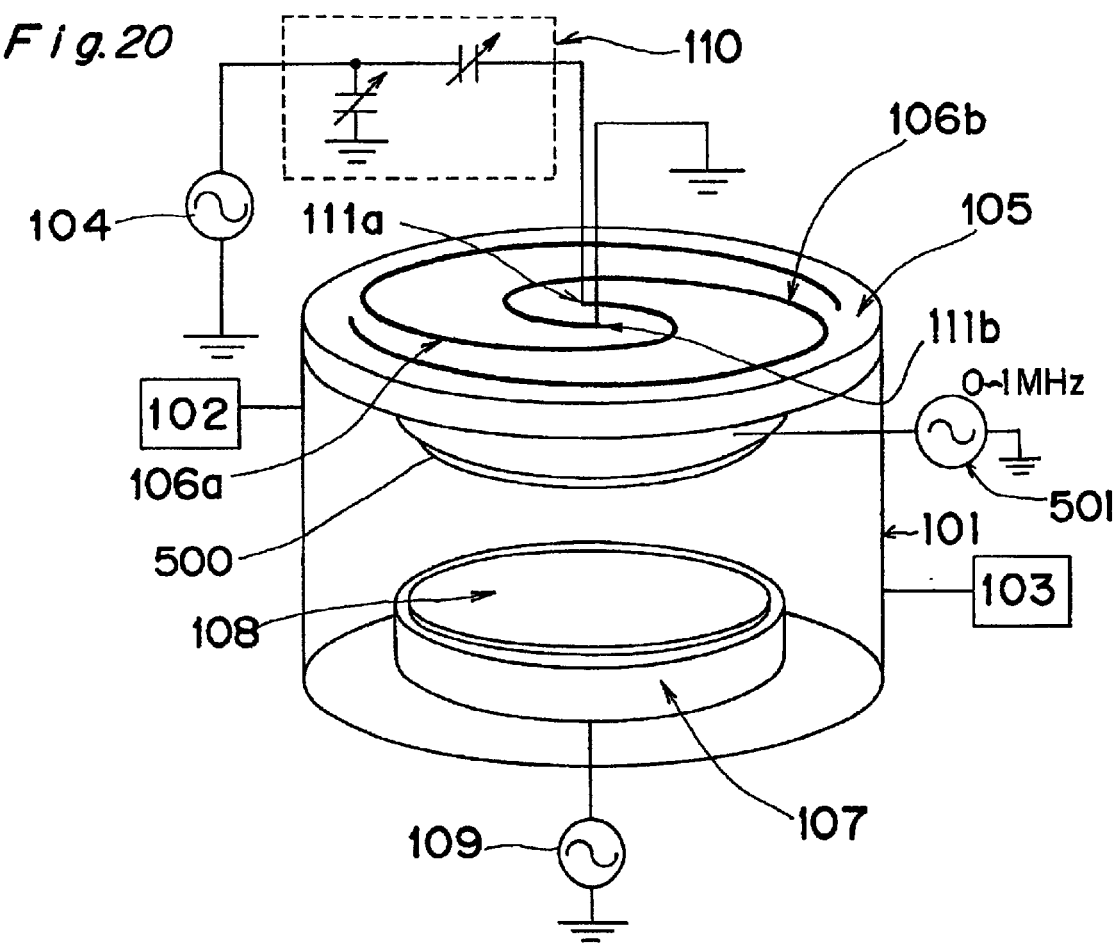
FIG. 20 is a perspective view showing an arrangement of a sputtering apparatus where a target is arranged on the inner surface of a top surface of a vacuum chamber of the plasma processing apparatus used in the first embodiment of the invention.

A case where the plasma processing apparatus according to the first embodiment of the invention is used as a sputtering apparatus is shown in FIG. 20. That is, FIG. 20 is a perspective view showing the schematic arrangement of the sputtering apparatus where a target 500 is arranged on the inner surface of the vacuum chamber 101 of the plasma processing apparatus and 0–1 MHz high frequency power is applied to the target 500 by a high frequency power source 501. The target 500 is arranged, for example, on the inner surface of the vacuum chamber 101, above the substrate 108 within the vacuum chamber 101. This sputtering apparatus can create the same effects of the plasma processing apparatus used in the first embodiment of the invention. The plasma processing apparatus of each of the other embodiments can also be used as a sputtering apparatus by arranging the target 500 on the inner surface of the vacuum chamber 101, above the substrate 108 within the vacuum chamber 101 in the above similar manner.

The entire disclosures of Japanese Patent Applications No. 9-75436 filed on Mar. 27, 1997 and No. 9-132110 filed on May 22, 1997, including specifications, claims, drawings, and summaries are incorporated herein by reference in their entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:

a vacuum chamber;

a device for supplying gas into the vacuum chamber;

a device for exhausting the vacuum chamber;

a high-frequency power source for supplying high-frequency power;

an electrode within the vacuum chamber for placing a substrate thereon;

a dielectric;

a first conductor located on the dielectric and having a vortex shape, one end of the first conductor being opened and the other end of the first conductor being connected to a hot side of the high-frequency power source; and a second conductor located on the dielectric and having a vortex shape, one end of the second conductor being opened and the other end of the second conductor being grounded.

2. A plasma processing apparatus as claimed in claim 1, further comprising;

a device for modulating the high-frequency power supplied to the first conductor in a pulsing fashion; and a device for supplying high-frequency power to the electrode, wherein the high-frequency power supplied by the high-frequency power source has a frequency of 50 to 150 MHz, wherein a ratio of a maximum value to a minimum value of the high-frequency power is 10 or more, wherein a center-side end portion of the vortex formed by the first conductor is connected to the hot side of the high-frequency power source, and wherein the plasma processing apparatus is operable at a pressure of not more than 2 Pa.

3. A plasma processing apparatus as claimed in claim 1, wherein the first conductor and the second conductor are provided inside or outside of the vacuum chamber.

4. A plasma processing apparatus as claimed in claim 1, wherein the first conductor and the second conductor form multiple vortices.

5. A plasma processing apparatus comprising:

a vacuum chamber;

a device for supplying gas into the vacuum chamber;

a device for exhausting the vacuum chamber;

a high-frequency power source for supplying high-frequency power;

an electrode within the vacuum chamber for placing a substrate thereon;

a dielectric;

a first conductor located on the dielectric and having a vortex shape, one end of the first conductor being opened and the other end of the first conductor being connected to a hot side of the high-frequency power source; and a second conductor located on the dielectric and having a vortex shape, one end of the second conductor being opened and the other end of the second conductor being grounded, wherein a length of the first conductor is approximately ¼, ½ or ⅝ of a wavelength of the high-frequency power or approximately the same as the wavelength of the high-frequency power, and a length of the second conductor is approximately ¼, ½ or ⅝ of the wavelength of the high-frequency power or approximately the same as the wavelength of the high-frequency power.

6. A plasma processing apparatus comprising:

a vacuum chamber;

a device for supplying gas into the vacuum chamber;

a device for exhausting the vacuum chamber;

a high-frequency power source for supplying high-frequency power;

an electrode located within the vacuum chamber for placing a substrate thereon;

a dielectric;

a first conductor located on the dielectric and having a vortex shape, one end of the first conductor being opened and the other end of the first conductor being connected to a hot side of the high-frequency power source; and a second conductor located on the dielectric and having a vortex shape, one end of the second conductor being opened and the other end of the second conductor being grounded, wherein each of the first and second conductors is substantially planar, and at an intersecting point at which a straight line passing through a center-side end portion of the vortex formed by the first conductor crosses the first conductor on a plane on which the first conductor is located, an angle formed by a tangential line of the first conductor and the straight line is generally constant along the length of the first conductor, and at an intersecting point at which a straight line passing through a center-side end portion of the vortex formed by the second conductor crosses the second conductor on a plane on which the second conductor is located, an angle formed by a tangential line of the second conductor and the straight line is generally constant along the length of the second conductor.

* * * * *